US012653015B2

(12) United States Patent
Chen et al.

(10) Patent No.: US 12,653,015 B2
(45) Date of Patent: Jun. 9, 2026

(54) SRAM MIDDLE STRAP WITH FEEDTHROUGH VIA

(71) Applicant: Taiwan Semiconductor Manufacturing Company, Ltd., Hsin-Chu (TW)

(72) Inventors: Jui-Lin Chen, Taipei (TW); Feng-Ming Chang, Hsinchu County (TW); Ping-Wei Wang, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 450 days.

(21) Appl. No.: 18/469,756

(22) Filed: Sep. 19, 2023

(65) Prior Publication Data

US 2025/0096076 A1     Mar. 20, 2025

(51) Int. Cl.
*H01L 23/48* (2006.01)
*H01L 23/522* (2006.01)
(Continued)

(52) U.S. Cl.
CPC ........ *H01L 23/481* (2013.01); *H01L 23/5226* (2013.01); *H01L 23/5283* (2013.01); *H10B 10/125* (2023.02)

(58) Field of Classification Search
CPC ............... H01L 23/481; H01L 23/5226; H01L 23/5283; H01L 21/76895; H10B 10/125; H10B 10/12; H10D 89/10
(Continued)

(56) References Cited

U.S. PATENT DOCUMENTS 8,605,523 B2    12/2013   Tao et al.
8,630,132 B2    1/2014   Cheng et al.
(Continued)

FOREIGN PATENT DOCUMENTS

TW         202006929 A      2/2020
TW         202201658 A      1/2022
(Continued)

OTHER PUBLICATIONS

U.S. Appl. No. 18/454,963, filed Aug. 24, 2023 by inventors Ping Wei Wang and Jui-Lin Chen for "Memory Device Having Backside Power Vias", 26 pages of text, 14 pages of drawings.
(Continued)

*Primary Examiner* — Tong-Ho Kim
(74) *Attorney, Agent, or Firm* — HAYNES AND BOONE, LLP

(57) ABSTRACT

An integrated circuit includes a first SRAM cell and a second SRAM cell, each including a plurality of field-effect transistors (FETs), a front metal line over the FETs and a back metal line below the FETs, and a middle strap area disposed between the first SRAM cell and the second SRAM cell. The middle strap area includes a plurality of gate stacks extending lengthwise along a direction, a gate isolation structure extending through a gate stack of the plurality of gate stacks, a feedthrough via (FTV) embedded in the gate isolation structure, a first dielectric gate disposed between the conductive structure and the first SRAM cell, and a second dielectric gate disposed between the conductive structure and the second SRAM cell. The FTV electrically couples the front metal line and the back metal line.

20 Claims, 20 Drawing Sheets

(51) Int. Cl.
  *H01L 23/528* (2006.01)
  *H10B 10/00* (2023.01)

(58) Field of Classification Search
  USPC .......................................................... 257/288
  See application file for complete search history.

(56) References Cited

U.S. PATENT DOCUMENTS

|  | | | |
|---|---|---|---|
| 8,760,948 | B2 | 6/2014 | Tao et al. |
| 10,515,688 | B2 | 12/2019 | Liaw |
| 11,031,073 | B2 | 6/2021 | Liaw |
| 11,043,595 | B2 | 6/2021 | Su et al. |
| 11,127,746 | B2 | 9/2021 | Chang et al. |
| 2014/0032871 | A1 | 1/2014 | Hsu et al. |
| 2014/0153321 | A1 | 6/2014 | Liaw |
| 2014/0153345 | A1 | 6/2014 | Kim et al. |
| 2014/0177352 | A1 | 6/2014 | Lum |
| 2014/0233330 | A1 | 8/2014 | Ko et al. |
| 2014/0241077 | A1 | 8/2014 | Katoch et al. |
| 2014/0269114 | A1 | 9/2014 | Yang et al. |
| 2020/0251476 | A1* | 8/2020 | Chang ................... H01L 23/535 |
| 2021/0043635 | A1 | 2/2021 | Hsieh et al. |
| 2023/0124514 | A1 | 4/2023 | Liaw |
| 2023/0240087 | A1 | 7/2023 | Lu |
| 2024/0395665 | A1 | 11/2024 | Chen et al. |
| 2025/0048612 | A1* | 2/2025 | Chen ................... H01L 23/5283 |

FOREIGN PATENT DOCUMENTS

| | | |
|---|---|---|
| TW | 202240454 A | 10/2022 |
| TW | 202310301 A | 3/2023 |
| TW | 202314980 A | 4/2023 |
| TW | 202316583 A | 4/2023 |

OTHER PUBLICATIONS

U.S. Appl. No. 18/404,467, filed Jan. 4, 2024 by inventors Jui-Lin Chen, Feng-Ming Chang, Ping-Wei Wang, Yu-Bey Wu, Chih-Ching Wang for "Reduction Of Size Of Edge Cell Region In Memory Devices", 31 pages of text, 27 pages of drawings.

* cited by examiner $202 \begin{cases} 202a \\ 202b \end{cases}$

A $202\begin{cases}202a \\ 202b\end{cases}$

200

SRAM MIDDLE STRAP WITH FEEDTHROUGH VIA

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Static Random Access Memory (SRAM) is commonly used in integrated circuits. An SRAM array (or macro) usually uses edge/strap regions surrounding an array of bit cells which store data, such that the outmost bit cells of the SRAM array can have a similar environment as the inner bit cells thereof, thereby creating a more uniform operation of the bit cells regardless of the positions of the bit cells in the SRAM array, as compared to an SRAM array without edge/strap regions. On the other hand, if the edge/strap regions occupy a relatively large area, the edge/strap regions may consume a significant portion of the entire space available to manufacture a memory device and thus will limit scaling capability.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
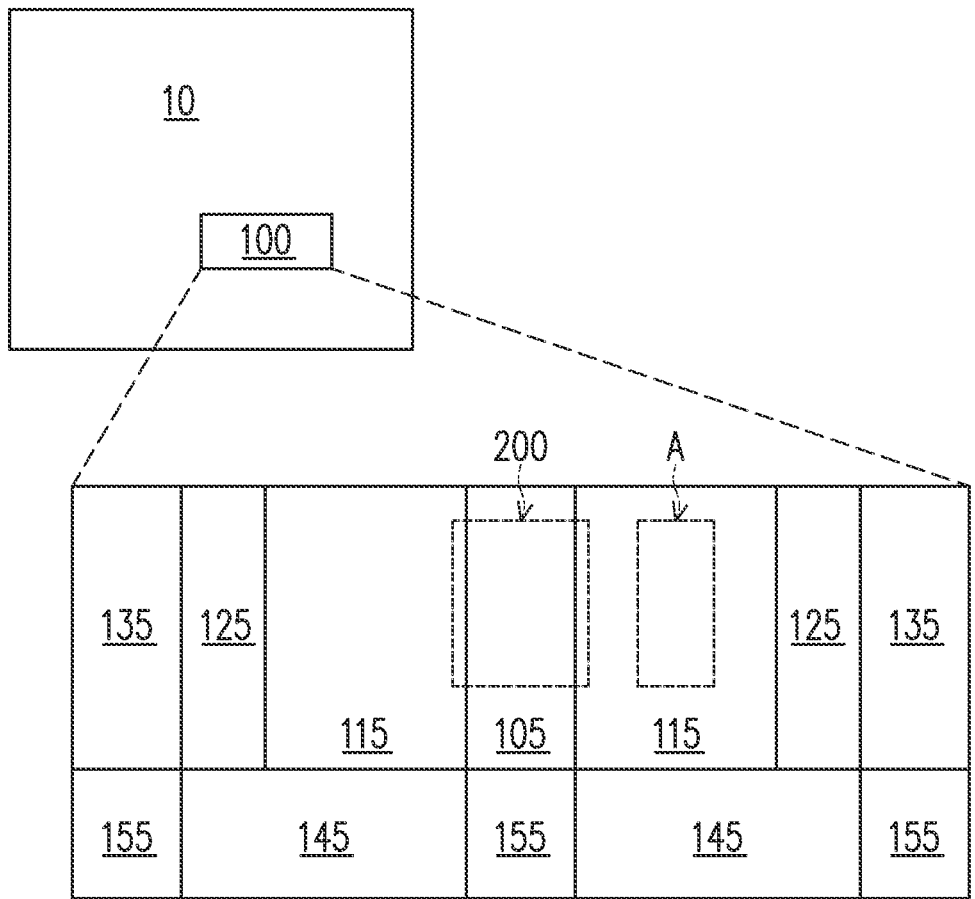
FIG. 1 is a top view of a portion of an integrated circuit (IC) structure according to various aspects of the present disclosure.
Figure 1:
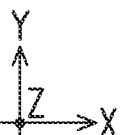

It is understood that the following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

In memory arrays, such as static random access memory (SRAM) arrays, each memory cell can store a bit of data. Memory cell performance can be largely layout dependent. For example, it has been observed that an inner memory cell of a memory array will perform differently than an edge memory cell of the memory array. In some implementations, inner memory cells and edge memory cells exhibit different threshold voltages ($V_t$), different on-currents ($I_{on}$), and/or a different off-currents ($I_{off}$). Middle strap areas have thus been implemented to stabilize well potential, facilitating uniform charge distribution throughout a memory array, and thus uniform performance among memory cells of the memory array. Although a middle strap area may not contain memory bits, it may take a relatively large area that increases the total area of the memory array.

The present disclosure is generally related to semiconductor devices, and more particularly an integrated circuit (IC) (e.g., a memory device) having a middle strap area sandwiched between two adjacent SRAM areas along a direction. The middle strap area includes a plurality of gate structures and/or a plurality of dielectric gate structures evenly distributed with a gate pitch (GP) along the direction. The middle strap area may include a gate isolation structure over at least one of the plurality of gate structures or one of the plurality of gate structures. Further, the middle strap area includes a conductive structure surrounded by the gate isolation structure. The conductive structure includes a feed-through via (FTV) and a conductive feature over the FTV. The FTV electrically couples a frontside interconnect structure and a backside interconnect structure of the IC. By implementing the design layouts disclosed herein, the middle strap area has a reduced width equal to or less than about nine (9) times of GP along the direction. Details of the proposed IC with the middle strap area are described below. Different embodiments may have different advantages, and no particular advantage is required of any embodiment.

FIG. 1 is a top view of a semiconductor device 10 (e.g., an integrated circuit (IC)) with a memory macro 100 according to various aspects of the present disclosure. The semiconductor device may include a substrate, a device layer (e.g., transistors, etc.) over the substrate, a frontside interconnect structure over the device layer, and a backside interconnect structure below the device layer and/or the substrate. The semiconductor device 10 can be, e.g., a microprocessor, an application specific integrated circuit (ASIC), a field programmable gate array (FPGA), or a digital signal processor (DSP). The exact functionality of the semiconductor device 10 is not a limitation to the provided subject matter. The memory macro 100 may be a single-port SRAM macro, a dual-port SRAM macro, or other types of memory macro. The memory macro 100 includes a plurality of memory bits for storage. In some embodiments, the semiconductor device 10 also includes peripheral logic circuits (not shown) adjacent to the memory macro 100 for implementing various functions such as write and/or read address decoder, word/bit selector, data drivers, memory self-testing, etc. Each of the memory bits and the logic circuits may be implemented with various PMOS and NMOS transistors such as planar transistors, FinFET, gate-all-around (GAA) nanosheet transistors, GAA nanowire transistors, or other types of transistors. Further, the memory macro 100 and the logic circuits may include various contact features (or contacts), vias, and metal lines for connecting source, drain, and gate electrodes (or terminals) of the transistors to form an integrated circuit.

The memory macro 100 includes one or more suitable memory devices, such as a static random-access memory (SRAM) structure, a dynamic random-access memory (DRAM) structure, a nonvolatile memory structure, other suitable memory structure or a combination thereof. Furthermore, the memory macro 100 includes one or more memory cells configured in an array. For example, the memory macro 100 includes a plurality of SRAM cells configured in an array.

The memory macro 100 includes various doped features, such as n-type doped wells (also referred to as N wells), p-type doped wells (also referred to as P wells), source and drain features, other doped features, or a combination thereof configured to form various devices or components of the devices, such as source and drain features of a field-effect transistor. In the present example, the semiconductor device 10 includes negatively doped wells (also referred to as N wells) and positively doped wells (also referred to as P wells). The N wells include negative dopant, such as phosphorus. And the P wells include positive dopant, such as boron. The N wells and the P wells are formed by suitable technologies, such as ion implantation, diffusion or a combination thereof.

In some embodiments, the semiconductor device 10 includes a substrate and the memory macro 100 may be formed over the substrate. In some embodiments, the substrate may be reduced at later fabrication stages. The substrate includes silicon. Alternatively, the substrate may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates also include a silicon-on-insulator (SOI) substrate. SOI substrates are fabricated using separation by implantation of oxygen (SIMOX), wafer bonding, and/or other suitable methods.

The substrate also includes various isolation features, such as isolation features formed on the substrate and defining various active regions on the substrate. The isolation feature utilizes isolation technology, such as shallow trench isolation (STI), to define and electrically isolate the various active regions. Each active region is surrounded by a continuous isolation feature such that it is separated from other adjacent active regions. The isolation feature includes silicon oxide, silicon nitride, silicon oxynitride, other suitable dielectric materials, or combinations thereof. The isolation feature is formed by any suitable process. As one example, forming STI features includes a lithography process to expose a portion of the substrate, etching a trench in the exposed portion of the substrate (for example, by using a dry etching and/or wet etching), filling the trench (for example, by using a chemical vapor deposition process) with one or more dielectric materials, and planarizing the substrate and removing excessive portions of the dielectric material(s) by a polishing process, such as a chemical mechanical polishing (CMP) process. In some examples, the filled trench may have a multi-layer structure, such as a thermal oxide liner layer and filling layer(s) of silicon nitride or silicon oxide.

In some embodiments, the semiconductor device 10 includes the frontside interconnect structure over the memory macro 100. The frontside interconnect structure may include multiple patterned dielectric layers and conductive layers that provide interconnections (e.g., wiring) between the various microelectronic components (e.g., transistors such as FETs) formed within the memory macro 100 and upper conductive features (e.g., conductive features over the frontside interconnect structure). As noted, the frontside interconnect structure may include a plurality of conductive features and a plurality of dielectric layers used to provide isolation between the conductive features. In some embodiments, the dielectric layers of the frontside interconnect structure may include silicon oxide, low-k dielectric layer (e.g., having a dielectric constant less than that of $SiO_2$ which is about 3.9), other suitable dielectric material or a combination thereof. In some examples, the dielectric layers may include tetraethylorthosilicate (TEOS) oxide, undoped silicate glass (USG), doped silicon oxide such as borophosphosilicate glass (BPSG), fluorosilicate glass (FSG), phosphosilicate glass (PSG), boron doped silicon glass (BSG), a low-k dielectric layer and/or other suitable dielectric material.

In some embodiments, the conductive features of the frontside interconnect structure may include contacts, vias, or metal lines (e.g., metal lines in metal layers M0, M1, M2, . . . ) to provide horizontal and vertical interconnections. In some cases, the metal lines include copper (Cu), aluminum (Al), an aluminum copper (AlCu) alloy, ruthenium (Ru), cobalt (Co), tungsten (W), or other appropriate metal.

In some embodiments, the metal lines, the contacts, and/or vias include a barrier layer and a bulk metal layer over the barrier layer.

In some embodiments, the semiconductor device 10 further includes the backside interconnect structure below the memory macro 100. Similar to the frontside interconnect structure, the backside interconnect structure may include conductive features (e.g., metal lines and vias) distributed in one or more dielectric layers. The conductive features of the backside interconnect structure may provide interconnections (e.g., wiring) between the various microelectronic components (e.g., transistors such as FETs) formed within the memory macro 100 and lower conductive features (e.g., conductive features below the backside interconnect structure). The metal lines of the backside interconnect structure may be disposed in backside metal layers, such as BM0, BM1, etc. The frontside and backside interconnect structures are coupled through various conductive features and a feedthrough via (FTV). The structure, composition, configuration and formation of the FTV are further described below in details.

Still referring to FIG. 1, the memory macro 100 includes two memory bit areas 115, a middle strap area 105 (or strap area 105) disposed between the two memory bit areas 115, two edge areas 125 disposed outside the two memory bit areas 115, two standard cell areas 135 disposed outside the two edge areas 125, two word line strap areas 145 disposed on ends of the two memory bit areas 115 and the two edge areas 125, and dummy areas 155. The middle strap area 105 may be in a middle portion of the memory macro 100. In the depicted embodiment, the middle strap area 105 is oriented lengthwise along the Y direction. The standard cell areas 135 includes one or more standard cell to be retrieved from the standard cell library and to be placed as a portion (such as digital, analogue or other circuit module) of the integrated circuit. The edge area 125 is a transitional region inserted between the memory bit area 115 and the standard cell area 135 to provide transition functions including isolation and integration.

In the present embodiment, the middle strap area 105, the two edge areas 125, and the dummy areas 155 do not contain memory bits. The middle strap area 105, the two edge areas 125, and the two word line strap areas 145 may be used for implementing well pick-up (WPU) structures. Therefore, they are also referred to as well pick-up areas, for example, for supplying voltages (or biasing) to N wells and P wells in the memory macro 100.

For a relatively big memory macro, the voltage drop along the wells might be significant, which would result in insufficient biasing for the wells in the middle portion of the memory macro. To resolve this issue, the memory macro 100 includes the middle strap area 105. The memory macro 100 may contain more than one middle strap area 105 in various embodiments depending on the size of the memory macro 100. The details of the middle strap area 105 are further discussed with reference to FIGS. 3-20.

Figure 2A:
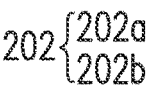
FIGS. 2A and 2B are top views of an area A of the IC structure of FIG. 1, according to various aspects of the present disclosure.
Figure 2A:
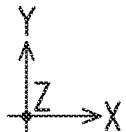
Figure 2B:
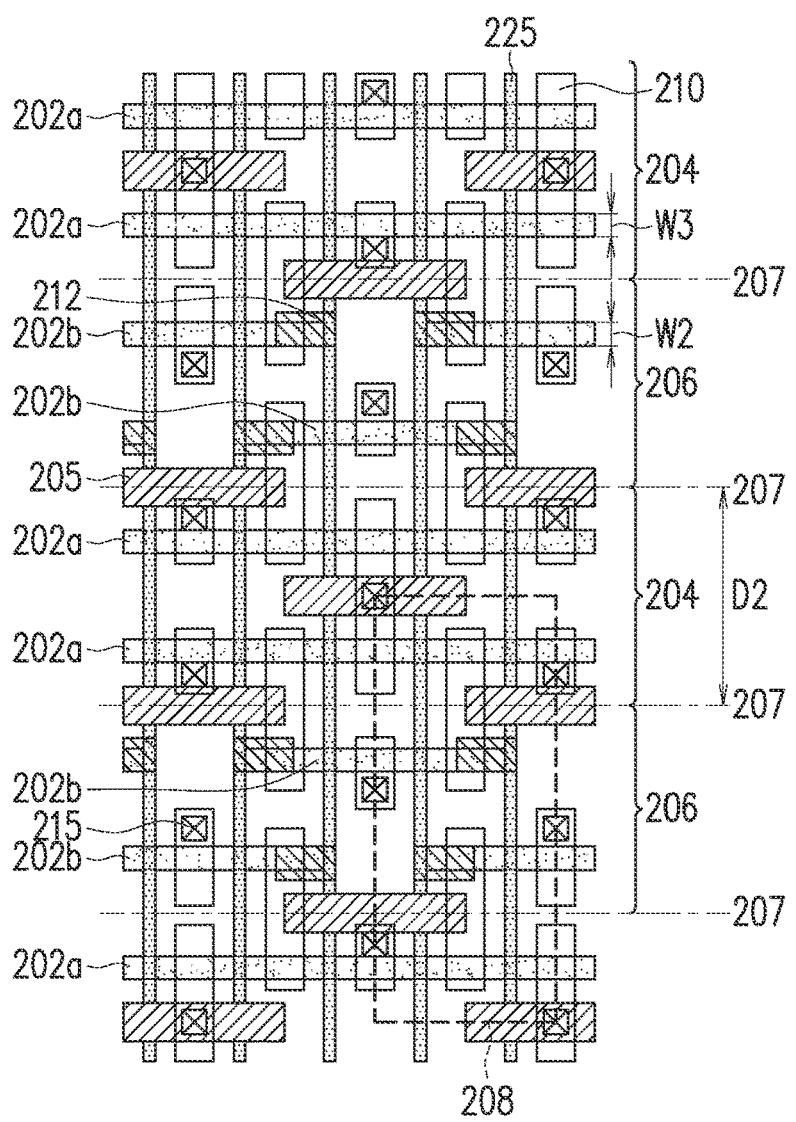

The two memory bit areas 115 contain all the memory bits (implemented as transistors) of the memory macro 100. FIGS. 2A and 2B are top views (or a layout) of an area A of the two memory bit areas 115 of FIG. 1, according to various aspects of the present disclosure. Referring to FIGS. 2A and 2B, the two memory bit areas 115 include P wells 204 and N wells 206 alternately arranged along the Y direction. In other words, every P well 204 is next to an N well 206 which is next to another P well 204, and this pattern repeats. The boundary between any two oppositely doped wells is indicated with a dashed line 207. Over the wells, the two memory bit areas 115 include active regions 202a and 202b oriented lengthwise generally along the X direction perpendicular to the Y direction, and gate structures 225 oriented lengthwise generally along the direction X. The active regions 202a and 202b can be separately or collectively referred to as active regions 202. The active regions 202a and 202b are properly doped for forming transistors. For example, the active regions 202a are over the P wells 204 and doped with n-type dopants for forming NMOSFET, and the active regions 202b are over the N wells 206 and doped with p-type dopants for forming PMOSFET. In the depicted embodiment in FIG. 2A, the active regions 202a each has a width W1 along the Y direction, the active regions 202b each has a width W2 along the Y direction, and W1 is greater than W2. In some alternative embodiments as depicted in FIG. 2B, the active regions 202a each has a width W3 along the Y direction, the active regions 202b each has the width W2 along the Y direction, and W3 is equal to W2. Accordingly, a width D1 of the P well 204 in FIG. 2A is greater than a width D2 of the P well 204 in FIG. 2B. The active regions 202a and 202b may include fins or fin active regions for FinFETs in an embodiment or may include vertically stacked multiple nanowires or nanosheets for gate-all-around (GAA) FETs in another embodiment. The active regions 202a and 202b may take other suitable forms or shapes (such as planar active regions for planar MOSFETs). The gate structures 225 may include high-k metal gate (HK/MG) structures (i.e., having one or more metal layers over a high-k gate dielectric layer) in an embodiment, and may include other materials and/or configuration in various embodiments. The gate structures 225 engage the active regions 202a and 202b to form various transistors (not labeled), such as NMOS FinFETs, PMOS FinFETs, NMOS GAA FETs, and PMOS GAA FETs. The gate structures 225 each include a gate dielectric layer and a gate electrode. The gate structures 225 are a feature of a FET and functions with other features, such as source/drain (S/D) features and a channel, wherein the channel is in a portion of the active regions 202 directly underlying the gate structures 225; and the S/D features are in the active regions 202 and are disposed on two sides of the gate structures 225.

The transistors are properly coupled to form memory bits. For example, the transistors in the dashed box 208 are coupled to form one memory bit, such as an SRAM cell. In furtherance of the example, the SRAM cell includes two inverters cross-coupled together and two pass gates. Each pass gate further includes one N-type FET, and each inverter includes one N-type FET and one P-type FET properly connected. The two memory bit areas 115 further include dielectric features 205 that are oriented lengthwise generally along the X direction. The dielectric features 205 may be disposed along portions of the well boundaries (indicated with dashed lines 207) for isolating the adjacent wells. Thus, they are also referred to as isolation features 205. In some embodiments, the dielectric features 205 are disposed along portions of the SRAM cell boundaries for isolating the adjacent SRAM cells. In such embodiments, the dielectric features 205 are disposed between portions of the adjacent active regions 202a for isolating the adjacent active regions 202a. In embodiments, the dielectric features 205 are gate cut features that divide the otherwise continuous gate structures into isolated segments corresponding to the gate structures 225 as depicted.

In the depicted embodiment, the memory macro 100 further includes various contacts (e.g., contacts 210 and 215) and vias 212 over the active regions 202a and 202b. The contacts 210 and 215 and vias 212 may connect various portions (such as source, drain, and/or gate stack) on or over the active regions 202a and 202b with the frontside interconnect structure over the SRAM cells. For example, the contacts 210 may be source/drain contacts that connect the source/drain with the frontside interconnect structure over the SRAM cells. It is understood that positions, shapes, and sizes of the various contacts 210 and 215 and the vias 212 are not limited by the depicted embodiments in the present disclosure. For the purpose of simplicity, the contacts 210 and the vias 212 are not depicted in the following figures.

Figure 3:
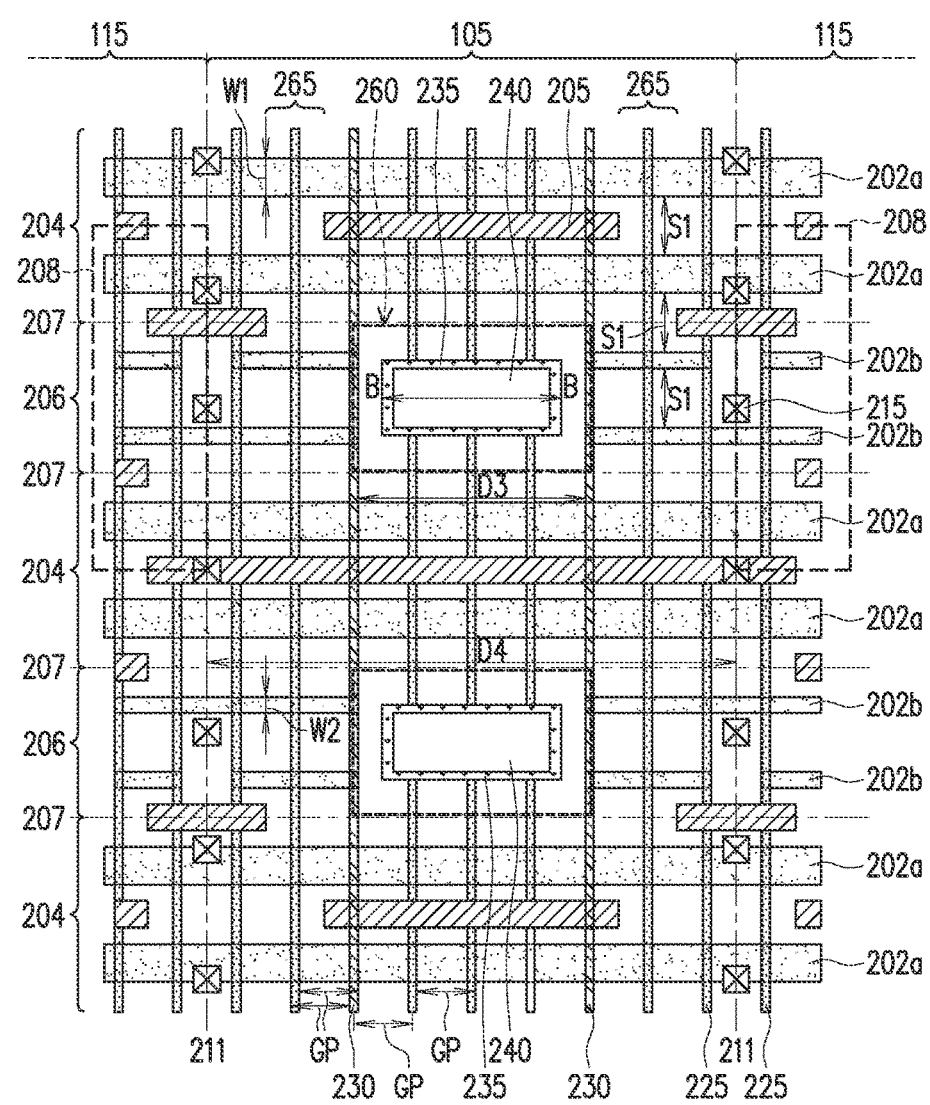
FIGS. 3, 5, 6, 7, 8, 9, 10, 11, 12, 13, 14, 15, 16, 17, 18, and 19 are top views of an area 200 of the IC structure of FIG. 1, according to various aspects of the present disclosure.

Referring to FIG. 3, shown therein is a top view (or a layout) of an area 200 of FIG. 1 according to some aspects of the present disclosure. The dashed boxes 208 show positions of two SRAM cells in the two memory bit areas 115. The middle strap area 105 includes P wells 204 and N wells 206 alternately arranged along the Y direction. The boundaries between the P wells 204 and the N wells 206 are indicated with dashed lines 207. In some embodiments, the P wells 204 and the N wells 206 in the middle strap area 105 extend continuously into the two memory bit areas 115. In other words, the P wells 204 in the middle strap area 105 and in the two memory bit areas 115 may be portions of the same P wells, and the N wells 206 in the middle strap area 105 and in the two memory bit areas 115 may be portions of the same N wells.

The middle strap area 105 further includes active regions 202a over the P wells 204 and active regions 202b over the N wells 206. The active regions 202a and 202b can be separately or collectively referred to as active regions 202. The active regions 202a and 202b are oriented lengthwise generally along the X direction. In the depicted embodiment, the active regions 202a in the middle strap area 105 extend continuously into the two memory bit areas 115. In other words, the active regions 202a in the middle strap area 105 and in the two memory bit areas 115 may be portions of the same active regions 202a. The continuous active regions 202a may bring benefit (e.g., reduce process steps) in fabricating the middle strap area 105 together with the two memory bit areas 115. The continuous active regions 202a may reduce the distance between boundaries 211 between the middle strap area 105 and the two memory bit areas 115. The boundaries 211 are also boundaries of the SRAM cells that are immediately adjacent to the middle strap area 105. In some embodiments, the active regions 202b in the middle strap area 105 are aligned with the active regions 202b in the two memory bit areas 115 along the X direction. But they are separate from each other. In some other embodiments, the active regions 202b in the middle strap area 105 extend continuously into one of the two memory bit areas 115. In some embodiments, similar as described with reference to FIG. 2A, the active regions 202a and 202b each have the width W1 and W2, respectively, along the Y direction. A distance between the adjacent active regions 202a and 202b is S1 as shown in FIG. 3.

The active regions 202a and 202b in the middle strap area 105 may have the same shape and configuration as the active regions 202a and 202b in the two memory bit areas 115. For example, the active regions 202a and 202b have the widths W1 and W2 along the Y direction, respectively. For example, the active regions 202a and 202b have channel regions directly under the gate structures 225 (to be described below) and doped regions (e.g., source/drain regions) disposed on two sides of the gate structures 225. In some embodiments, the active regions 202a over the P wells 204 may be doped with n-type dopants for forming NMOS-FET, and the active regions 202b over the N wells 206 may be doped with p-type dopants for forming PMOSFET.

Further, the active regions 202a and 202b in the middle strap area 105 may include fins or fin active regions, vertically stacked multiple nanowires or nanosheets, or planar active regions.

The middle strap area 105 further includes gate structures 225 (also referred to as gate stacks 225) oriented lengthwise generally along the Y direction. The gate structures 225 in the middle strap area 105 may have the same shape and configuration as the gate structures 225 in the two memory bit areas 115. For example, the gate structures 225 may include high-k metal gate (HK/MG) structures in an embodiment and may include other materials and/or configuration in various embodiments.

The middle strap area 105 further includes the isolation features 205 oriented lengthwise generally along the X direction and disposed along portions of the well boundaries (indicated with dashed lines 207) for isolating the adjacent wells and disposed between adjacent active regions 202a for isolating the adjacent active regions 202a. In embodiments, the isolation features 205 are gate cut features that divide the otherwise continuous gate structures into isolated segments corresponding to the gate structures 225 as depicted. In some embodiments, the isolation features 205 extend from the middle strap area 105 to the two memory bit areas 115. In some other embodiments, the isolation features 205 extend within the middle strap area 105. This effectively reduces the leakage between the oppositely doped wells 204 and 206 and reduces the leakage between the adjacent active regions 202a. The isolation features 205 also separate a portion of or all the gate structures 225 in the middle strap area 105. Portions of the active regions 202a between adjacent feedthrough structures 240 (to be described below) and the isolation features 205 therebetween provide isolation between the adjacent feedthrough structures 240.

Still referring to FIG. 3, the middle strap area 105 further includes two dielectric gates 230 disposed over the active regions 202a and 202b in the middle strap area 105. The dielectric gates 230 are not metal gates and do not function as gate structures. Instead, the dielectric gates 230 are dielectric features that include one or more dielectric material and function as isolation features, in some instances.

Each of the dielectric gates 230 has an elongated shape oriented in the Y direction. In some embodiments, the dielectric gates 230 are formed in a continuous-poly-on-diffusion-edge (CPODE) process. In a CPODE process, at least a portion of a polysilicon gate (also referred to as a dummy gate) and the channel region of the active region thereunder are replaced by a dielectric feature. For purposes of this disclosure, a "diffusion edge" may be equivalently referred to as an active edge, where for example an active edge abuts adjacent active regions. The dielectric gates 230 are also referred to as CPODE features 230. The dielectric gates 230 may vertically extend into the substrate. The dielectric gates 230 may have a length of about 1 to about 400 μm along the Y direction. Furthermore, the dielectric gates 230 may be disposed and configured differently and therefore function differently. In some embodiments, the dielectric gates 230 and the gate structures 225 are evenly distributed with a gate pitch (GP). Examples of gate pitches are illustrated in FIG. 3 as either the edge-to-edge distance between two adjacent gate structures 225 and/or dielectric gates 230, or as the center-to-center distance instead of edge-to-edge distance in some embodiments. In some embodiments, a width of a gate structure 225 or a dielectric gate 230 is much less than a GP, thus a distance between two adjacent gate structures 225 and/or dielectric gates 230 is about the same as a GP. In the depicted embodiment, the two dielectric gates 230 extend through the active regions 202a and are disposed on edges (or ends) of the active regions 202b in the middle strap area 105 to function as isolation to separate one SRAM cell to an adjacent SRAM cell. Having the dielectric gates 230 may avoid or reduce mushroom defect, which refers to undesired epitaxial growth on an excessive portion of a dummy gate (e.g., on edges or ends of the active regions 202b), which may result from an overlay shift of a photolithography mask when forming the dummy gate.

Still referring to FIG. 3, the middle strap area 105 further includes gate isolation structures 235 disposed between the two dielectric gates 230. In the depicted embodiment, gate isolation structures 235 extend lengthwise along the X direction and extend through the gate structures 225 to divide the gate structures 225, and are disposed between the two dielectric gates 230. The gate isolation structures 235 may provide isolation between the feedthrough structure 240 and the adjacent active regions 202a and 202b and the gate structures 225.

Figure 4:
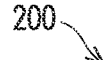
FIG. 4 is a cross-sectional view of the IC structure of FIG. 3 along a B-B line, according to various aspects of the present disclosure.
Figure 4:
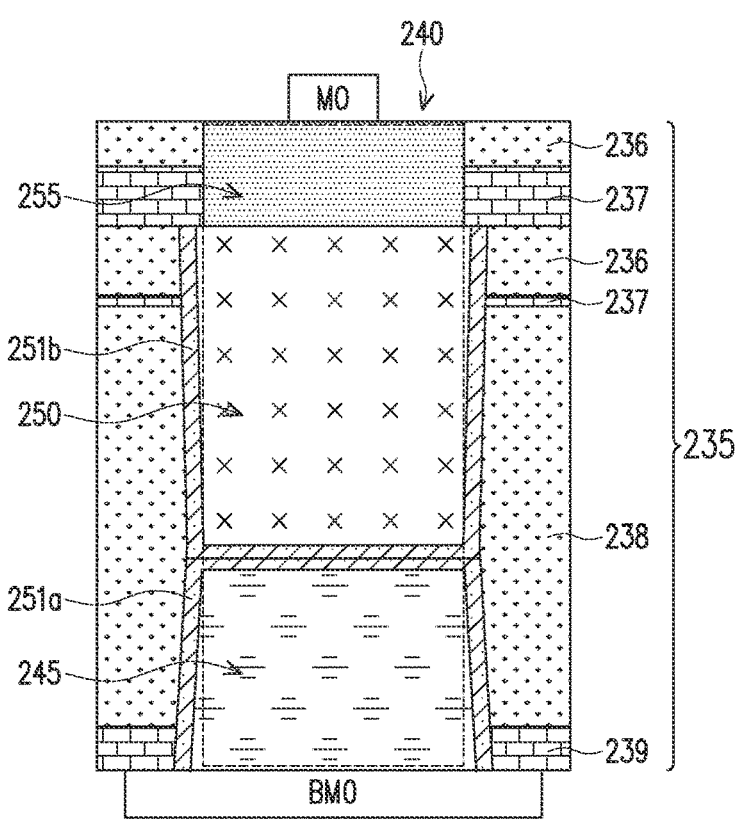

FIG. 4 shows a cross-sectional view along the B-B line of FIG. 3 according to some aspects of the present disclosure. The gate isolation structures 235 may include any suitable material, such as a dielectric material including silicon oxide, silicon nitride, silicon oxynitride, or a combination thereof. The gate isolation structure 235 is a dielectric structure implemented to cut a long gate stack into two or more shorter gate stacks. The gate isolation structure 235 is formed by patterning that includes lithography process and etch; deposition and polishing such as chemical mechanical polishing (CMP). The gate isolation structure 235 and other dielectric layers also provide an environment where a FTV is disposed in. Accordingly, in this particular case, the gate isolation structure 235 and the other dielectric layers are collectively referred to as the gate isolation structure 235. In some embodiments, the gate isolation structure 235 includes a plurality of dielectric layers. In some examples, the gate isolation structure 235 includes interlayer dielectric (ILD) layers 236, etch stop layers (ESLs) 237 and 239, and a dielectric layer 238. The ILD layers 236 may include silicon oxide, a silicon oxide containing material, or a low-k dielectric layer such as TEOS oxide, undoped silicate glass (USG), doped silicon oxide such as BPSG, FSG, PSG, BSG, and/or other suitable dielectric material. In some embodiments, the ILD layers 236 include silicon oxide or a silicon oxide containing material. In various examples, the ILD layers 236 may be deposited by chemical vapor deposition (CVD), physical vapor deposition (PVD), atomic layer deposition (ALD), or combinations thereof. In some cases, the ESLs 237 and 239 include a nitrogen-containing material and/or a carbon-containing material. For example, the ESLs 237 and 239 may include silicon carbon nitride (SiCN), silicon oxycarbide (SiOC), silicon carbide (SiC), silicon oxycarbonitride (SiOCN), silicon nitride (SiN), or combinations thereof. In some embodiments, the ESLs 237 and 239 include SiN. In various examples, the ESLs 237 and 239 may be deposited by CVD, ALD, PVD, or combinations thereof. In some embodiments, the dielectric layer 238 includes similar materials as the ILD layers 236. In various examples, the dielectric layer 238 may be deposited by CVD, ALD, PVD, or combinations thereof.

In some embodiments, referring to FIGS. 3 and 4, the middle strap area 105 further includes a feedthrough structure 240 surrounded by each gate isolation structures 235 from a top view. The feedthrough structure 240 is a conductive structure that electrically couples the frontside interconnect structure (e.g., a metal line in M0 metal layer) to the backside interconnect structure (e.g., a metal line in BM0 metal layer). Referring to FIG. 4, in some embodiments, the feedthrough structure 240 includes a feedthrough via (FTV) 245 over the BM0 layer, a lower contact feature 250 over the FTV 245, and an upper contact feature 255 over the lower contact feature 250. The FTV 245, the lower contact feature 250, and the upper contact feature 255 may have the same or different shapes and/or dimensions from a top view. In some embodiments, the FTV 245, the lower contact feature 250, and the upper contact feature 255 are embedded in the gate isolation structures 235. The FTV 245, the lower contact feature 250, and the upper contact feature 255 may be formed by performing a patterning and lithography process to form trenches through portions of the gate isolation structure 235, then filling the trenches with metal features. In some embodiments, the FTV 245, the lower contact feature 250, and the upper contact feature 255 each include Cu, Al, an AlCu alloy, Ru, Co, W, or other appropriate metal layer. In some embodiments, the FTV 245, the lower contact feature 250, and the upper contact feature 255 each include a barrier layer (e.g., the barrier layers 251a and 251b) and a bulk metal layer over the barrier layer. In some embodiments, the lower contact feature 250 is formed at the same time and/or level as the source/drain contacts in the memory bit areas 115.

Referring back to FIG. 3, the feedthrough structure 240, the gate isolation structure 235, the surrounding area of the gate isolation structure 235, and portions of the dielectric gates 230 collectively form an isolation area 260. The isolation area 260 is disposed between two of the active regions 202a along the Y direction and disposed between two sets of the active regions 202b along the X direction for functions of isolation. Each set of the two sets of the active regions 202b includes two of the active regions 202b. In the depicted embodiment, the isolation area 260 extends between the ends of the two sets of the active regions 202b and has a shape of a rectangle. A length D3 of the isolation area 260 along the X direction is about four (4) times of GP. The isolation area 260 may provide isolation between the adjacent active regions 202a and 202b and isolation between the two memory bit areas 115.

Referring to FIG. 3, a distance D4 between boundaries 211 of the middle strap area 105 is about nine (9) times of GP. In some embodiments, the middle strap area 105 includes a sum of nine (9) gate structures 225 and dielectric gates 230. The boundaries 211 include the boundary 211 of the middle strap area 105 and the adjacent memory bit area 115 on the left and the boundary 211 of the middle strap area 105 and the adjacent memory bit area 115 on the right.

Figure 5:
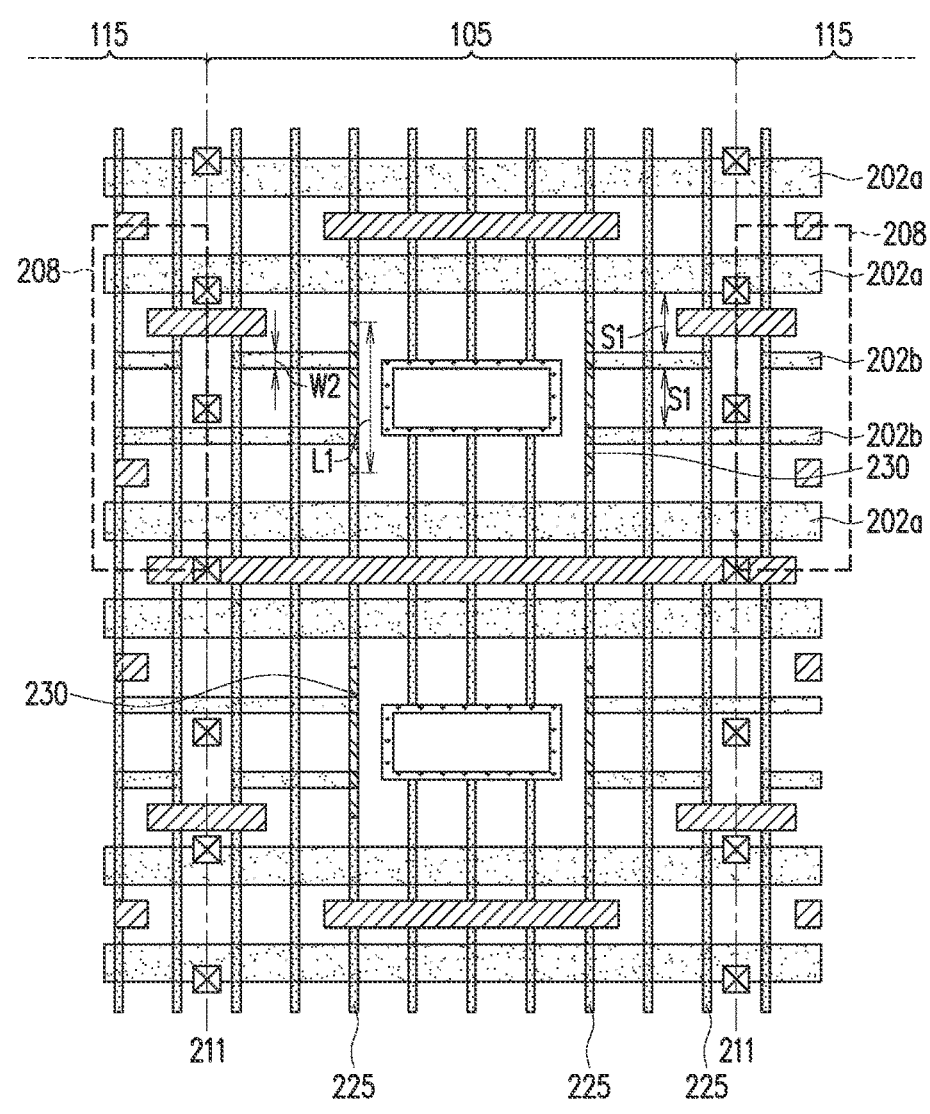

Referring to FIG. 5, shown therein is a top view (or a layout) of the area 200 of FIG. 1 according to an alternative aspect of the present disclosure. For example, in FIG. 5, in contrast to the area 200 in FIG. 3, the dielectric gates 230 do not extend through the active regions 202a. Instead, portions of the dielectric gates 230 extending through the active regions 202a in FIG. 3 are replaced by gate structures 225. In some embodiments, the dielectric gates 230 are still disposed on edges (or ends) of the active regions 202b in the middle strap area 105. The dielectric gates 230 may avoid or reduce mushroom defect as in the description of FIG. 3. Each of the dielectric gates 230 may have a length L1 along the Y direction. In some embodiments, the width of each of the active regions 202b is W2, a distance between adjacent active regions 202a and 202b is S1, and the length L1 is about (2*W2+2*S1). In some embodiments, the channel regions of the active regions 202 each have a channel length G1 along the X direction. In some embodiments, a ratio of W2 to G1 (W2/G1) is in a range of about 0.5 to about 10. In some embodiments, a ratio of S1 to G1 (S1/G1) is in a range of about 1 to about 10. In some embodiments, a ratio of L1 to G1 (L1/G1) is in a range of about 1 to about 40.

Figure 6:
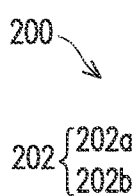
Figure 6:
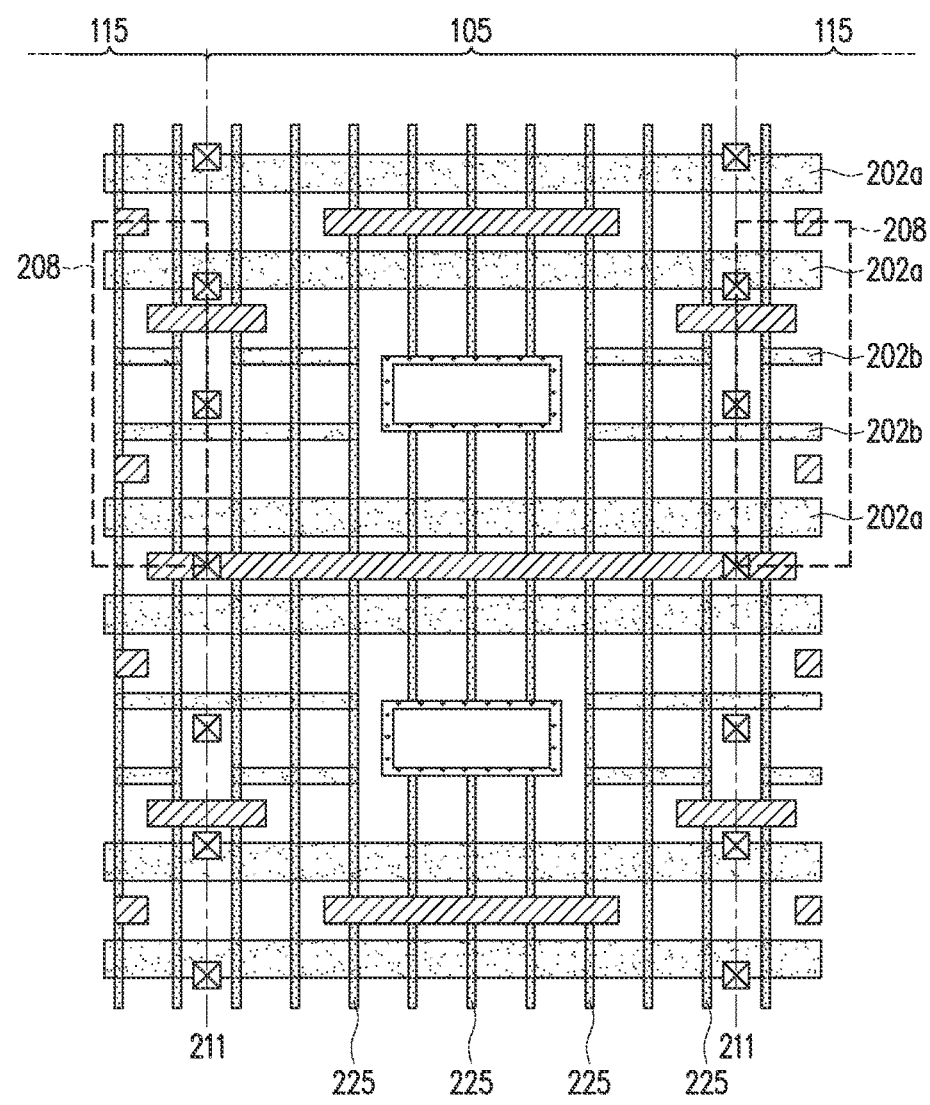

Referring to FIG. 6, shown therein is a top view (or a layout) of the area 200 of FIG. 1 according to another alternative aspect of the present disclosure. For example, in FIG. 6, in contrast to the area 200 in FIG. 3, the dielectric gates 230 are all replaced with two gate structures 225. In such embodiments, the gate structures 225 in this case may be connected to biased power for better isolation function and further enhancing the performance of the device. In some embodiments, the performance of the device may be risked or compromised by CPODE features due to different fabrication and composition. As no CPODE features exist in the middle strap area 105, those risks may be eliminated.

Figure 7:
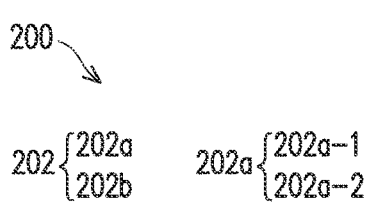
Figure 7:
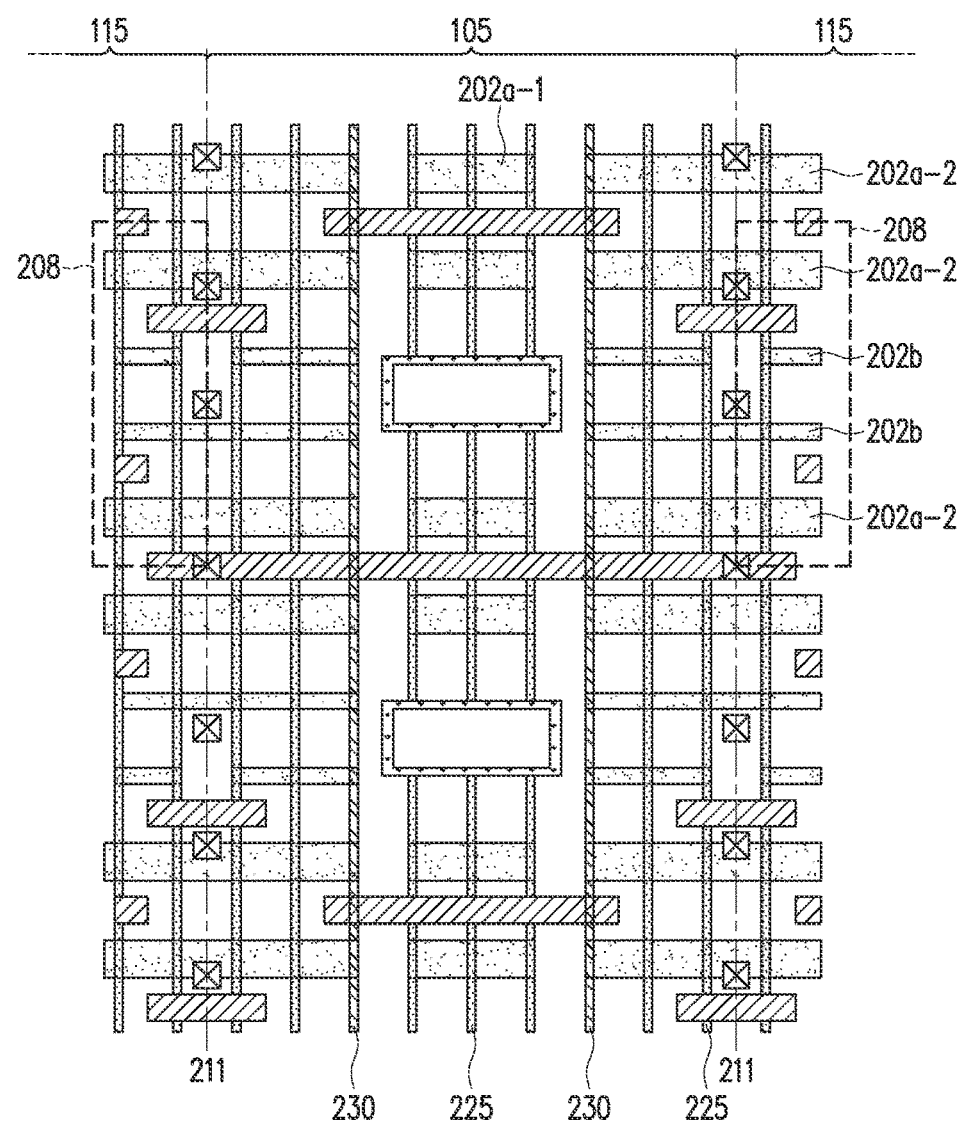

Referring to FIG. 7, shown therein is a top view (or a layout) of the area 200 of FIG. 1 according to another alternative aspect of the present disclosure. For example, in FIG. 7, in contrast to the area 200 in FIG. 3, the active regions 202*a* are divided into active regions 202*a*-1 extending in the middle strap area 105 and active regions 202*a*-2 extending from the middle strap area 105 to one of the memory bit areas 115. In some embodiments, the dielectric gates 230 are disposed on edges (or ends) of the active regions 202*a*-2 and 202*b* in the middle strap area 105. The dielectric gates 230 may avoid or reduce mushroom defect as in the description of FIG. 3 to edges (or ends) of the active regions 202*a*-2 and 202*b*. The discontinuous active regions 202*a* provides more isolation between the two memory bit areas 115.

Figure 8:
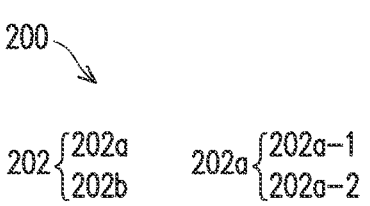
Figure 8:
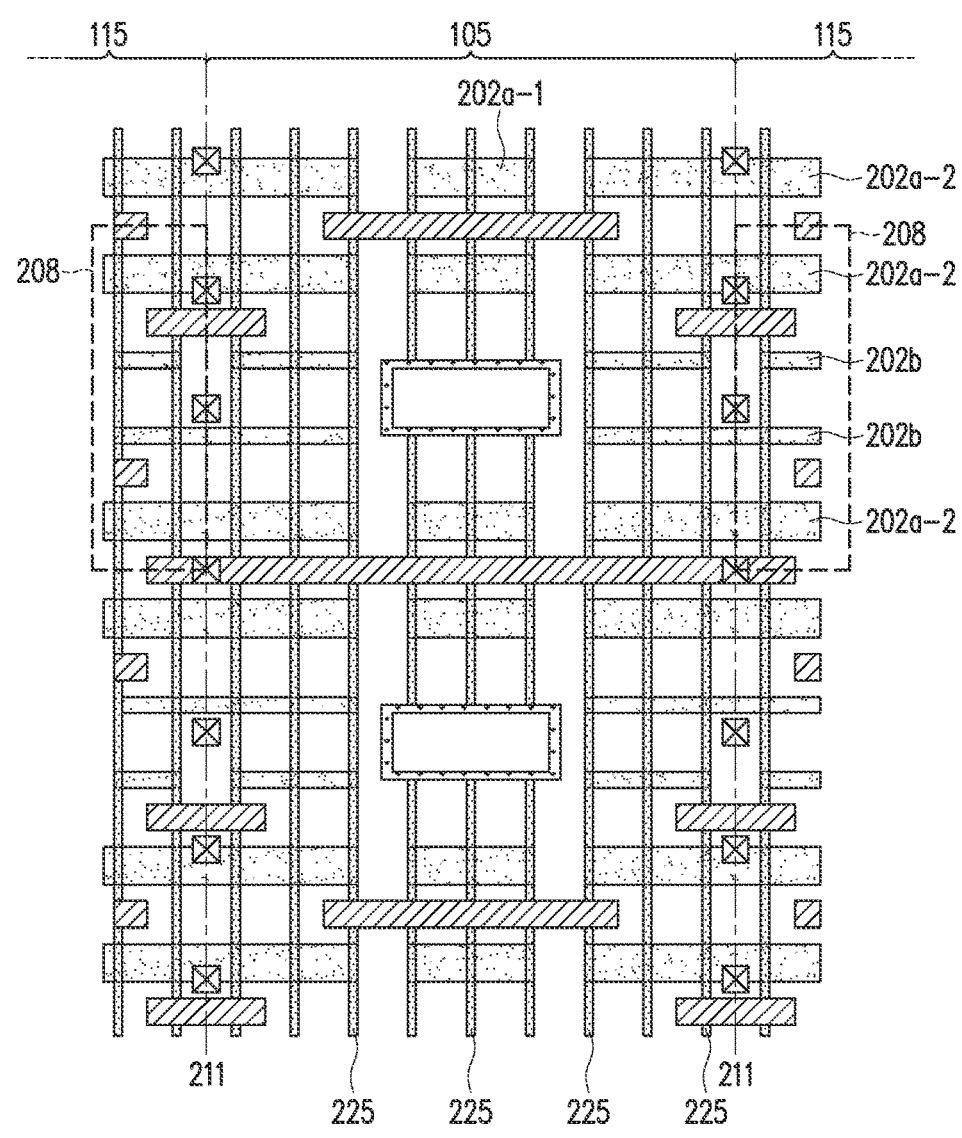

Referring to FIG. 8, shown therein is a top view (or a layout) of the area 200 of FIG. 1 according to another alternative aspect of the present disclosure. For example, in FIG. 8, in contrast to the area 200 in FIG. 7, the dielectric gates 230 are all replaced with two gate structures 225. In such embodiments, as no CPODE features exist in the middle strap area 105, similar advantages or benefits may present.

Figure 9:
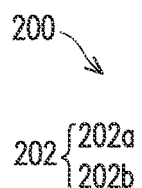
Figure 9:
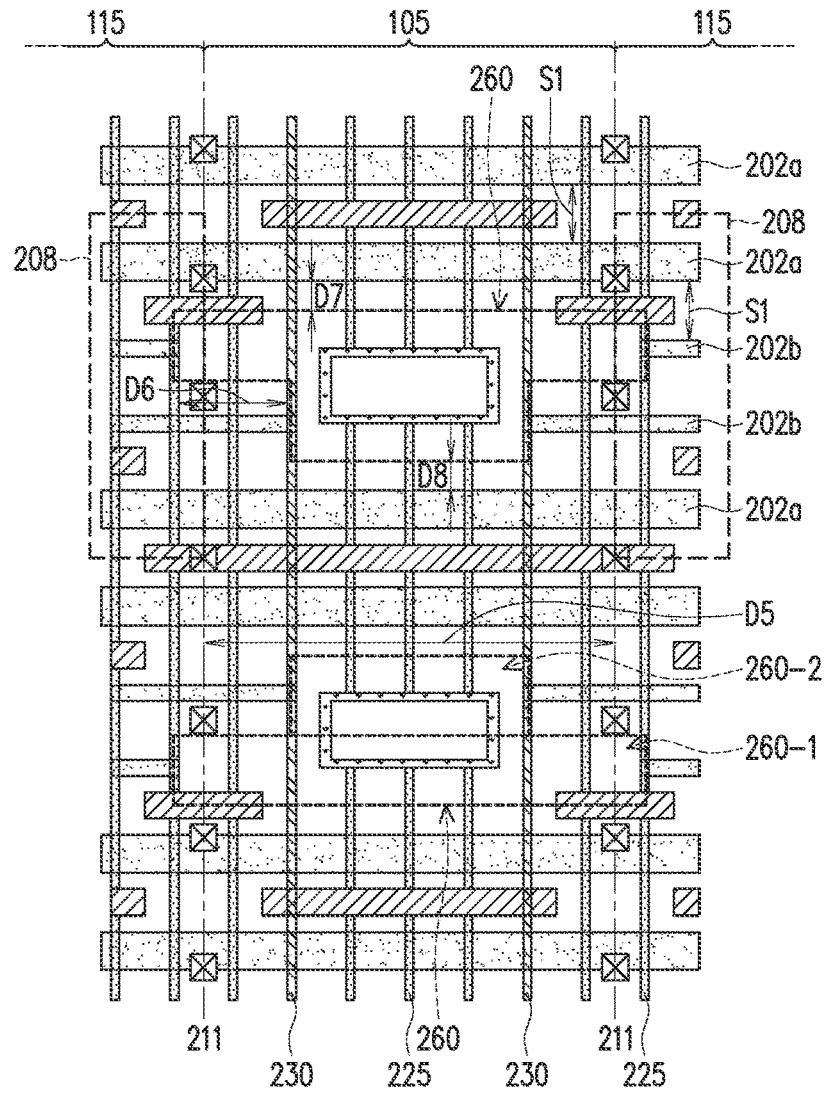

Referring to FIG. 9, shown therein is a top view (or a layout) of the area 200 of FIG. 1 according to another alternative aspect of the present disclosure. For example, in FIG. 9, in contrast to the area 200 in FIG. 3, the middle strap area 105 eliminates a dummy region 265 from each side of the isolation areas 260 and eliminates the active regions 202*b* extending only in the middle strap area 105. Therefore, a distance D5 between the boundaries 211 of the middle strap area 105 is reduced from D4 to about seven (7) times of GP. In some embodiments, the middle strap area 105 includes a sum of seven (7) gate structures 225 and dielectric gates 230.

Because the active regions 202*b* extending only in middle strap area 105 in FIG. 3 are eliminated, in the depicted embodiment in FIG. 9, the isolation area 260 has an upright or an upside-down "T" shape from a top view. The "T" shape includes a longer bar 260-1 and a shorter bar 260-2. The longer bar 260-1 extends between the two active regions 202*b* that extend only in the two memory bit areas 115. The longer bar 260-1 may have a length of about eight (8) times of GP along the X direction. The short bar 260-2 extends between the two active regions 202*b* that each extends from the middle strap area 105 to one of the memory bit areas 115. The short bar 260-2 may have a length of about four (4) times of GP along the X direction. In some embodiments, a distance D6 between edges of the longer bar 260-1 and the shorter bar 260-2 along the X direction is about two (2) times of GP. In some embodiments, a distance D7 between the longer bar 260-1 and the adjacent active region 202*a* is about half of the distance S1. In some embodiments, a distance D8 between the shorter bar 260-2 and the adjacent active region 202*a* is about half of the distance S1. The isolation area 260 may provide isolation between adjacent active regions 202*a* and 202*b*, as well as isolation between the two memory bit areas 115. Compared to the middle strap area 105 in FIG. 3, the middle strap area 105 in FIG. 9 has a smaller distance between the two boundaries 211, and an increased area of the isolation area 260. This may indicate that embodiments with reference to FIG. 9 have reduced area of the middle strap area 105, increased isolation between the two memory bit areas 115, and increased isolation between the feedthrough structure 240 and the active regions 202 compared to FIG. 3.

Figure 10:
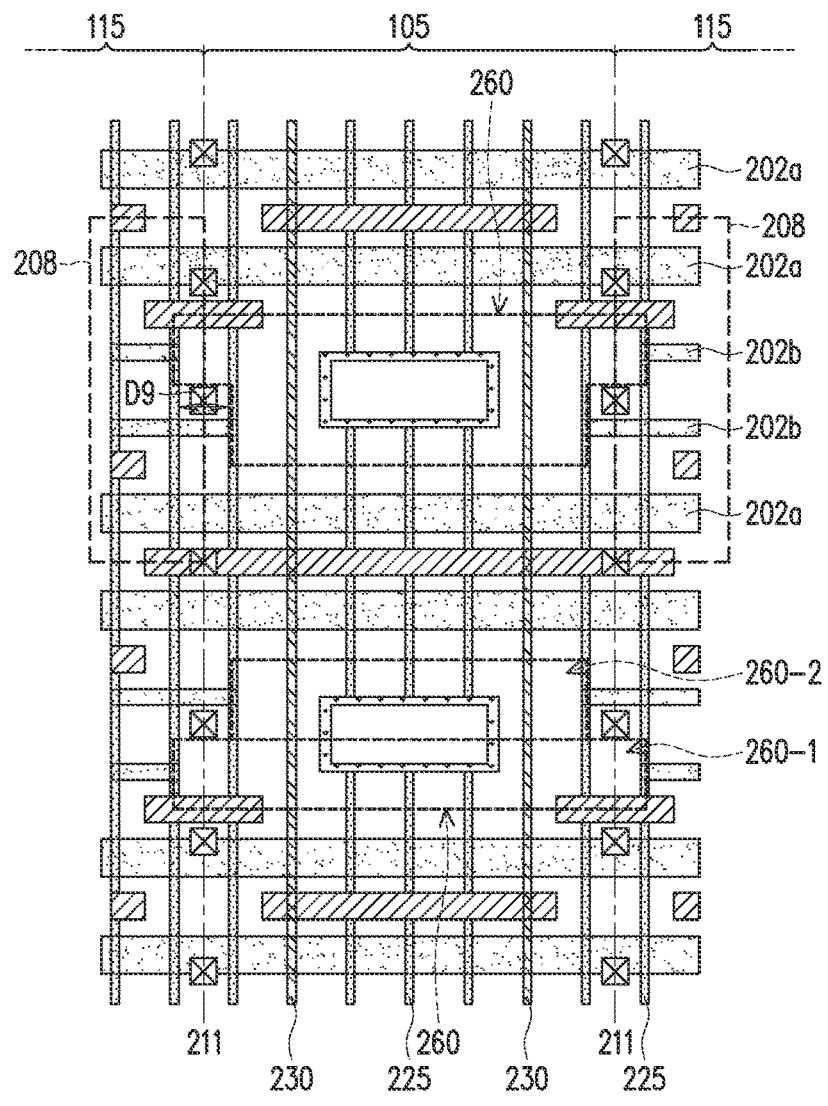

Referring to FIG. 10, shown therein is a top view (or a layout) of the area 200 of FIG. 1 according to another alternative aspect of the present disclosure. For example, in FIG. 10, in contrast to the area 200 in FIG. 9, a portion of the active regions 202*b* extending from one of the memory bit areas 115 to the middle strap area 105 is eliminated. Therefore, the shorter bar 260-2 is expanded towards the memory bit areas 115 and extends between the shortened active regions 202*b*. In the depicted embodiment, a distance D9 between edges of the longer bar 260-1 and the shorter bar 260-2 along the X direction is about one GP and is less than D6 in FIG. 9. The area of the isolation area 260 in FIG. 10 is greater than the area of the isolation area 260 in FIG. 9. This may indicate that embodiments with reference to FIG. 10 have increased isolation between the two memory bit areas 115, and increased isolation between the feedthrough structure 240 and the active regions 202 compared to FIG. 9.

Figure 11:
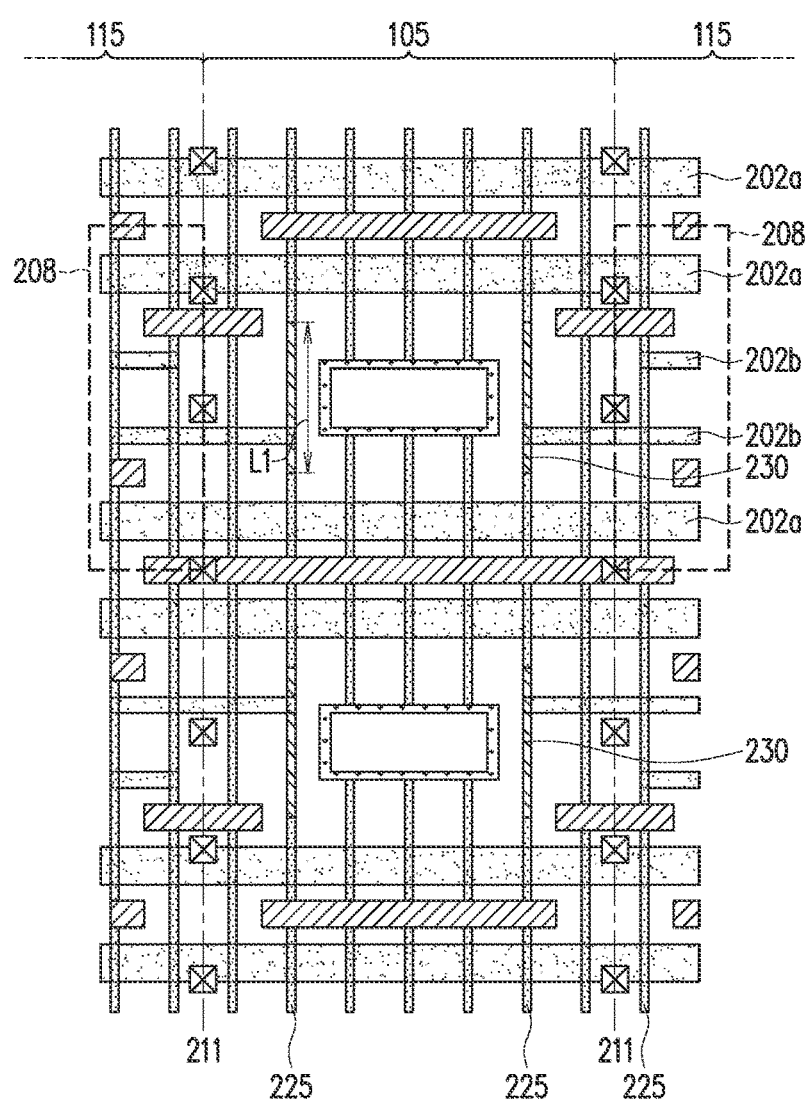

Referring to FIG. 11, shown therein is a top view (or a layout) of the area 200 of FIG. 1 according to another alternative aspect of the present disclosure. For example, in FIG. 11, in contrast to the area 200 in FIG. 9, the dielectric gates 230 do not extend through the active regions 202*a*. Instead, portions of the dielectric gates 230 extending through the active regions 202*a* in FIG. 9 are replaced by gate structures 225. The dielectric gates 230 are similar to those described with reference to FIG. 5, except that each of the dielectric gates 230 is on an edge of only one active region 202*b* and that L1 of FIG. 11 may be about (W2+S1) to about (2*W2+2*S1).

Figure 12:
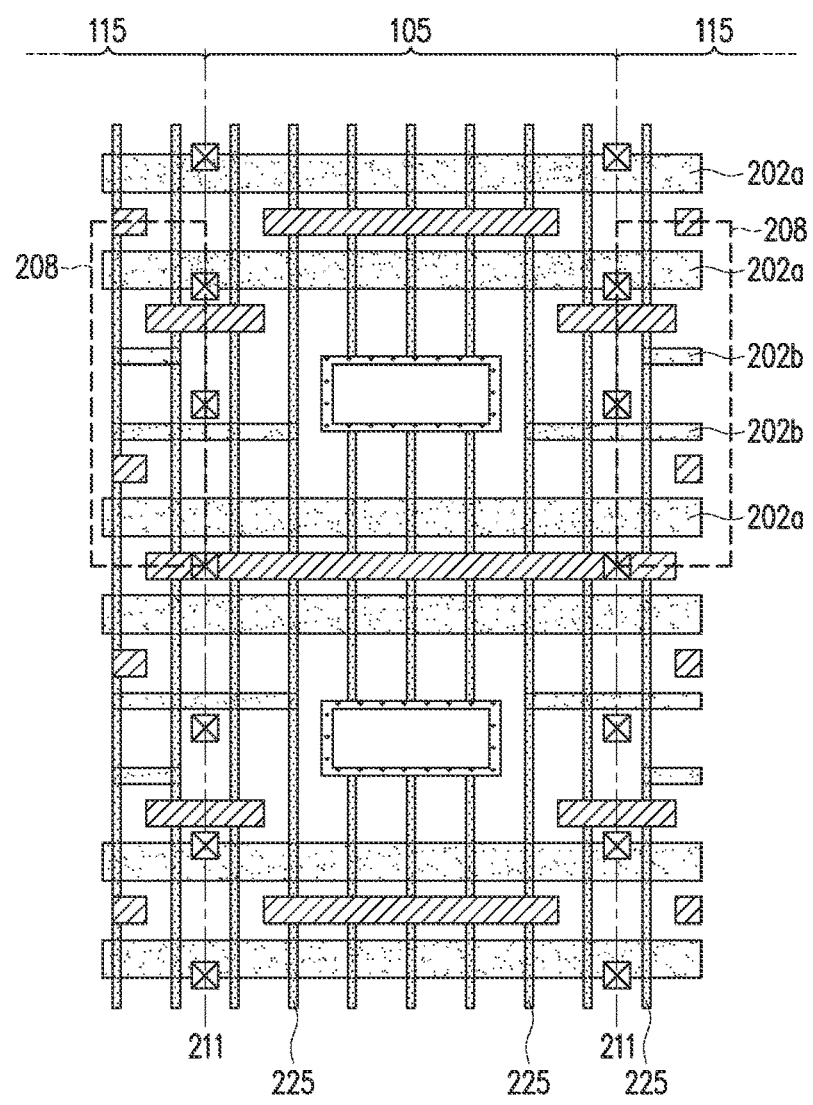

Referring to FIG. 12, shown therein is a top view (or a layout) of the area 200 of FIG. 1 according to another alternative aspect of the present disclosure. For example, in FIG. 12, in contrast to the area 200 in FIG. 9, the dielectric gates 230 are all replaced with two gate structures 225. In such embodiments, as no CPODE features exist in the middle strap area 105, similar advantages or benefits may present.

Figure 13:
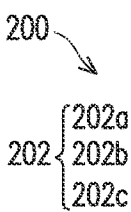
Figure 13:
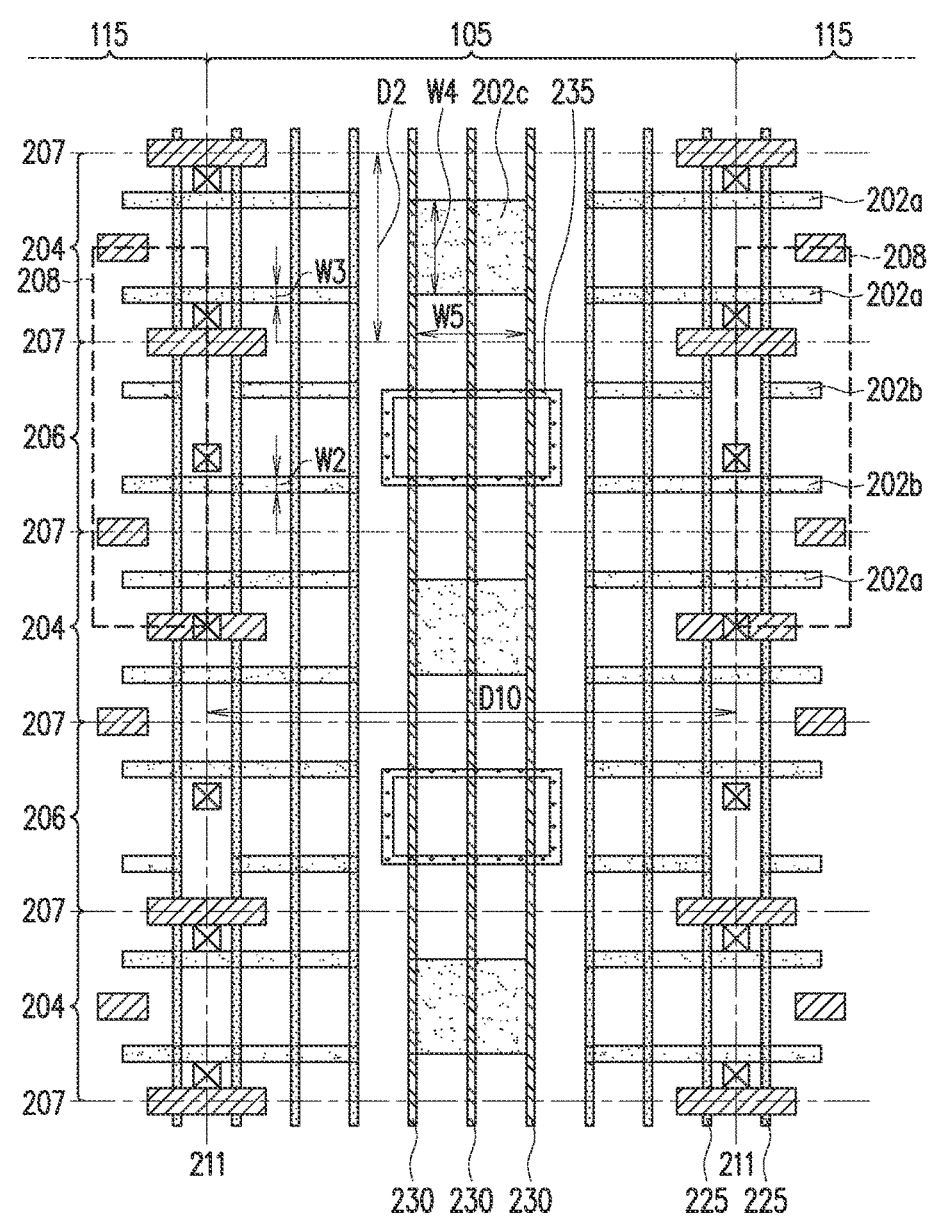
Figure 13:
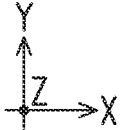

Referring to FIG. 13, shown therein is a top view (or a layout) of the area 200 of FIG. 1 according to another alternative aspect of the present disclosure. For example, in FIG. 13, in contrast to the area 200 in FIG. 3, the active regions 202*a* and 202*b* have the same width along the Y direction, and the active regions 202 further include active regions 202*c* disposed in the P wells 204 in the middle strap area 105. The active regions 202*a* do not extend continuously from one of the memory bit areas 115 to another memory bit areas 115 as in FIG. 3, instead, in FIG. 13, the active regions 202*a* extend from one of the memory bit areas 115 to the middle strap area 105. Similar to FIG. 2B, the active regions 202*a* and 202*b* have the widths W3 and W2 along the Y direction, respectively, and W2 is equal to W3.

In each P type well, the active regions 202c is disposed between two sets of the active regions 202a in the two memory bit areas 115 along the X direction. Each set of the two sets of the active regions 202a includes two of the active regions 202a. In some embodiments, the active regions 202c each have a length W4 along the Y direction. In some embodiments, W4 is greater than W2 or W3 and less than the width D2 of each of the P wells 204 along the Y direction. In some embodiments, W4 is about (2*W3+S1). In some embodiments, the active regions 202c each have a width W5 of about two times of GP along the X direction.

Another difference between the area 200 in FIG. 13 and FIG. 3 is that, in FIG. 13, the gate isolation structure 235 does not extend through the gate structures 225, instead, the gate isolation structure 235 extends through the dielectric gates 230. In the depicted embodiment, the middle strap area 105 includes three dielectric gates 230 and the gate isolation structure 235 extends through the three dielectric gates 230. In some embodiments, the dielectric gates 230 extend through the active regions 202c and/or are disposed on edges (or ends) of the active regions 202c. In some embodiments, one of the dielectric gates 230 extend through the active regions 202c and two of the dielectric gates 230 are disposed on edges (or ends) of the active regions 202c. In some embodiments, the gate structures 225 are disposed over the active regions 202a and 202b and/or on edges of the 202a and 202b. In the depicted embodiment, a distance D10 between the boundaries 211 of the middle strap area 105 is about nine (9) times of GP.

Figure 14:
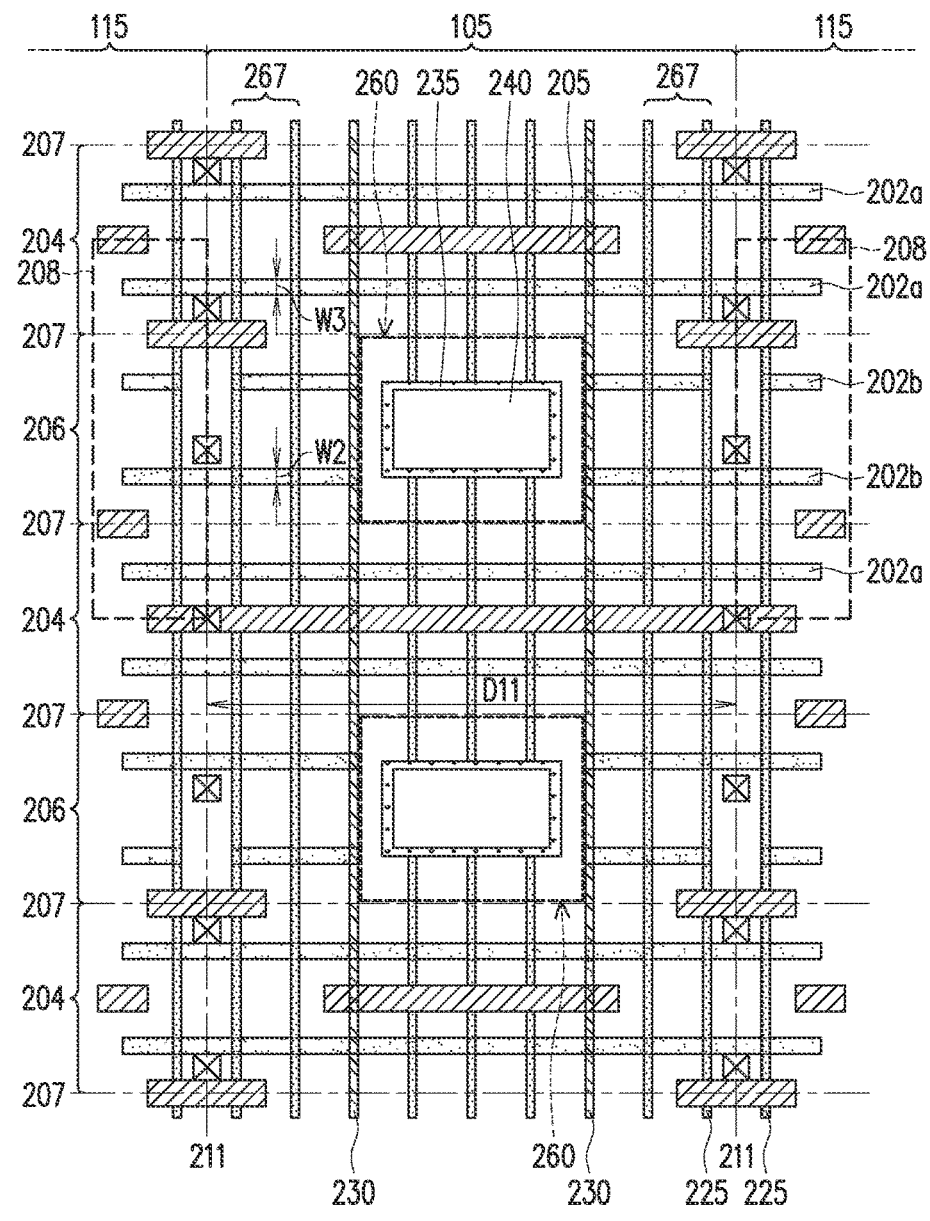

Referring to FIG. 14, shown therein is a top view (or a layout) of the area 200 of FIG. 1 according to another alternative aspect of the present disclosure. For example, in FIG. 14, in contrast to the area 200 in FIG. 3, the active regions 202a and 202b have the widths W3 and W2 along the Y direction, respectively, and W2 is equal to W3. In the depicted embodiment, a distance D11 between the boundaries 211 of the middle strap area 105 is about nine (9) times of GP. Portions of the active regions 202a between the adjacent feedthrough structures 240 and the isolation features 205 therebetween provide isolation between the adjacent feedthrough structures 240.

Figure 15:
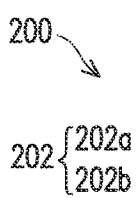
Figure 15:
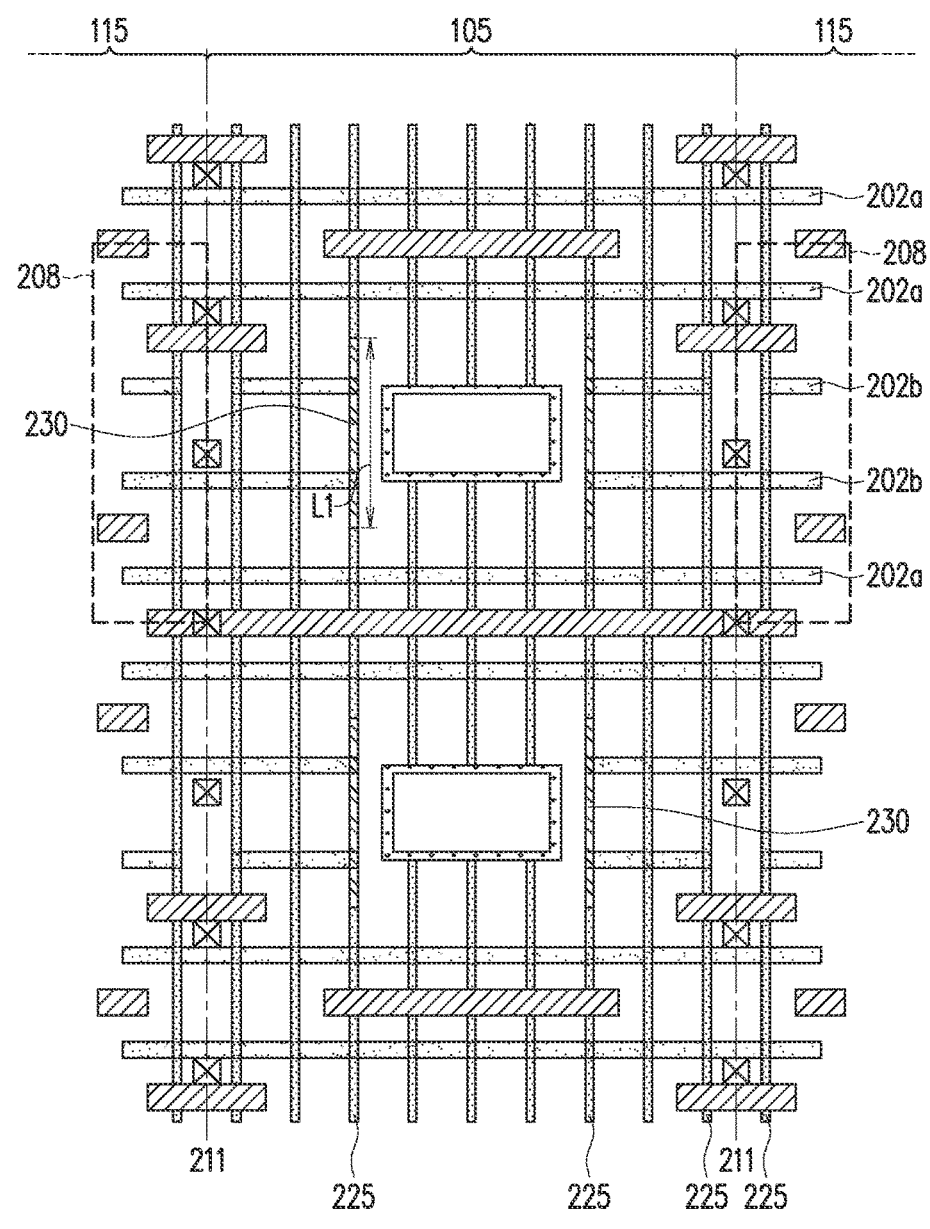

Referring to FIG. 15, shown therein is a top view (or a layout) of the area 200 of FIG. 1 according to another alternative aspect of the present disclosure. For example, in FIG. 15, in contrast to the area 200 in FIG. 14, the dielectric gates 230 do not extend through the active regions 202a. Instead, portions of the dielectric gates 230 extending through the active regions 202a in FIG. 14 are replaced by gate structures 225. The dielectric gates 230 are similar to those described with reference to FIG. 5.

Figure 16:
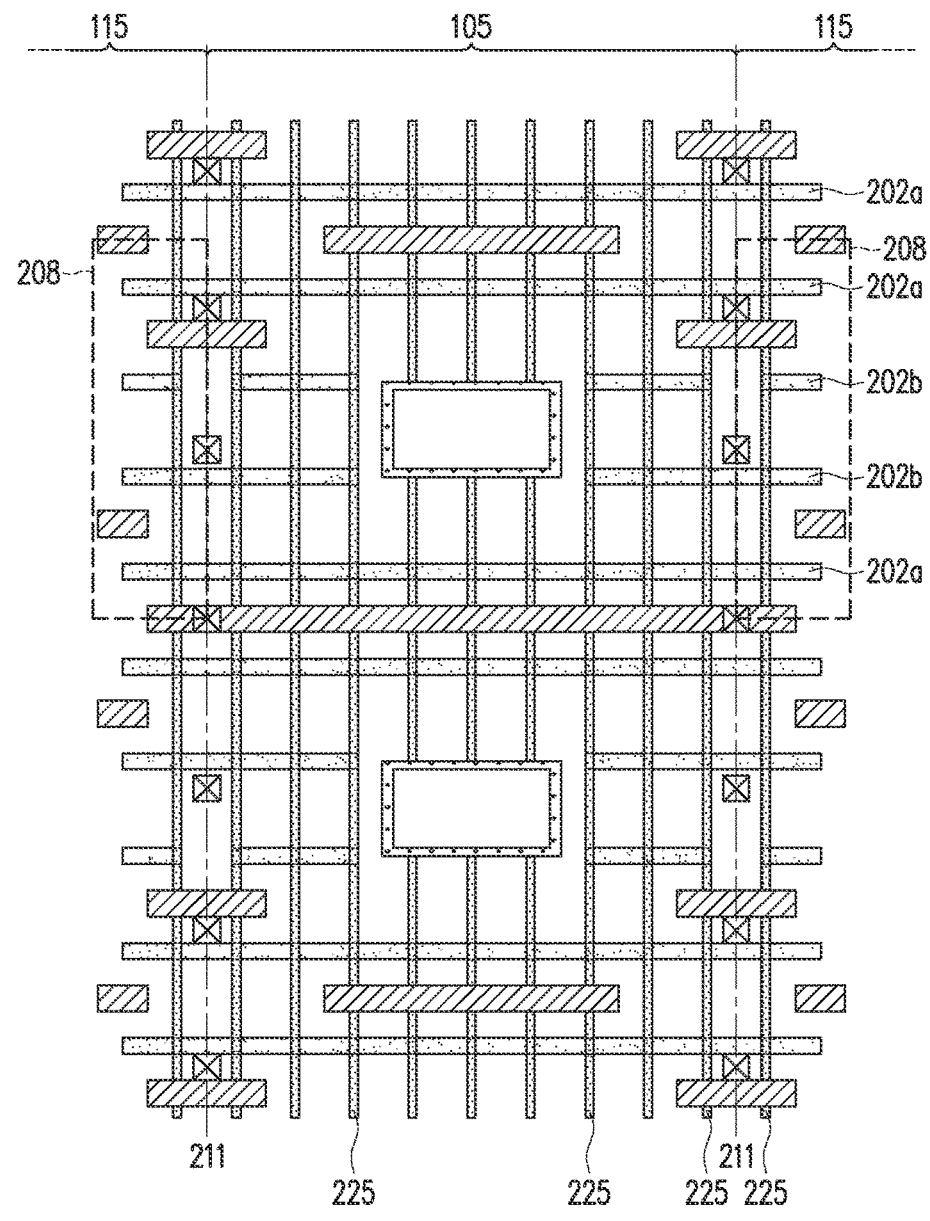

Referring to FIG. 16, shown therein is a top view (or a layout) of the area 200 of FIG. 1 according to another alternative aspect of the present disclosure. For example, in FIG. 16, in contrast to area 200 in the FIG. 14, the dielectric gates 230 are all replaced with two gate structures 225. In such embodiments, as no CPODE features exist in the middle strap area 105, similar advantages or benefits may present.

Figure 17:
Figure 17:
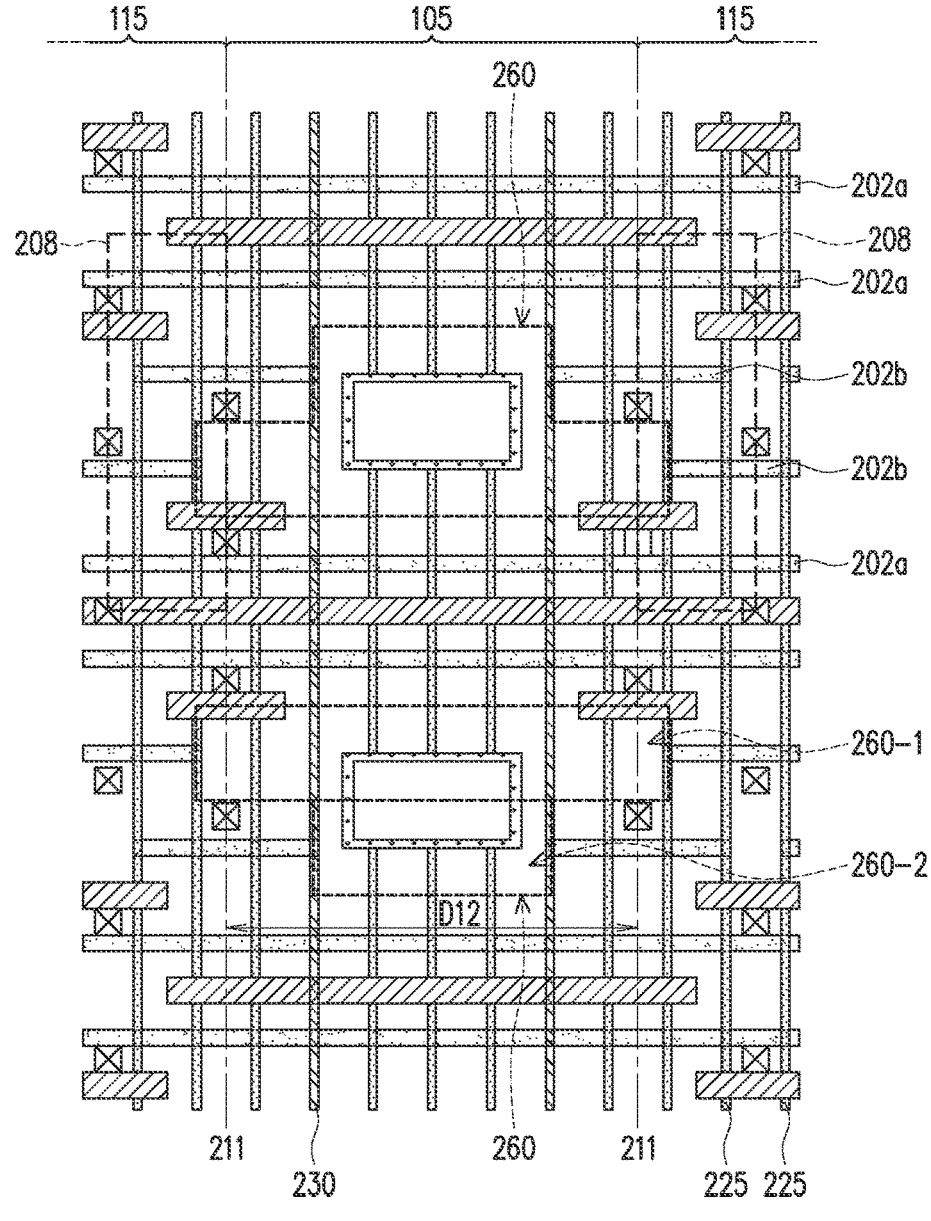
Figure 17:
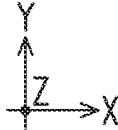

Referring to FIG. 17, shown therein is a top view (or a layout) of the area 200 of FIG. 1 according to another alternative aspect of the present disclosure. For example, in FIG. 17, in contrast to the area 200 in FIG. 14, the middle strap area 105 eliminates a dummy region 267 and one of the active regions 202b extending in the middle strap area 105 from each side of the isolation area 260. Therefore, a distance D12 between the boundaries 211 of the middle strap area 105 is reduced from D11 to about seven (7) times of GP.

Because one of the active regions 202b extending in the middle strap area 105 on each side of the isolation area 260 in FIG. 14 is eliminated, in the depicted embodiment in FIG. 17, the isolation area 260 has an upright or an upside-down "T" shape from a top view, similar to the isolation area 260 described with reference to FIG. 9. Although not depicted, the isolation area 260 in FIG. 17 may be similar as the isolation area 260 in FIG. 10. In other words, a distance between edges of the longer bar 260-1 and the shorter bar 260-2 of the isolation area 260 along the X direction may be one or two times of GP. Compared to FIG. 14, the middle strap area 105 in FIG. 17 has a smaller distance between the two boundaries 211, and an increased area of the isolation area 260. This may indicate that embodiments with reference to FIG. 17 have reduced area of the middle strap area 105, increased isolation between the two memory bit areas 115, and increased isolation between the feedthrough structure 240 and the active regions 202 compared to FIG. 14.

Figure 18:
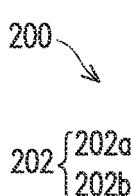
Figure 18:
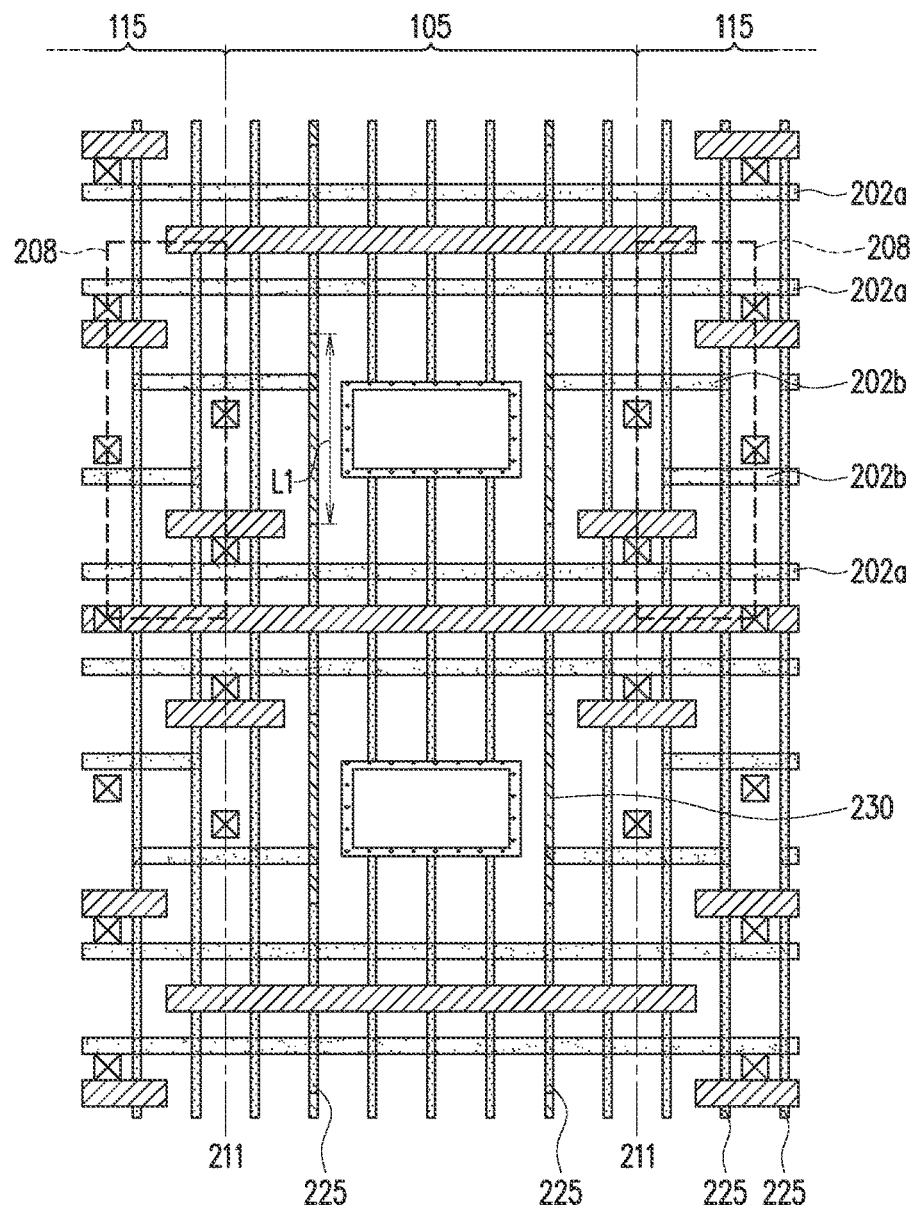

Referring to FIG. 18, shown therein is a top view (or a layout) of the area 200 of FIG. 1 according to another alternative aspect of the present disclosure. For example, in FIG. 18, in contrast to the area 200 in FIG. 17, the dielectric gates 230 do not extend through the active regions 202a. Instead, portions of the dielectric gates 230 extending through the active regions 202a in FIG. 17 are replaced by gate structures 225. The dielectric gates 230 are similar to those described with reference to FIG. 11.

Figure 19:
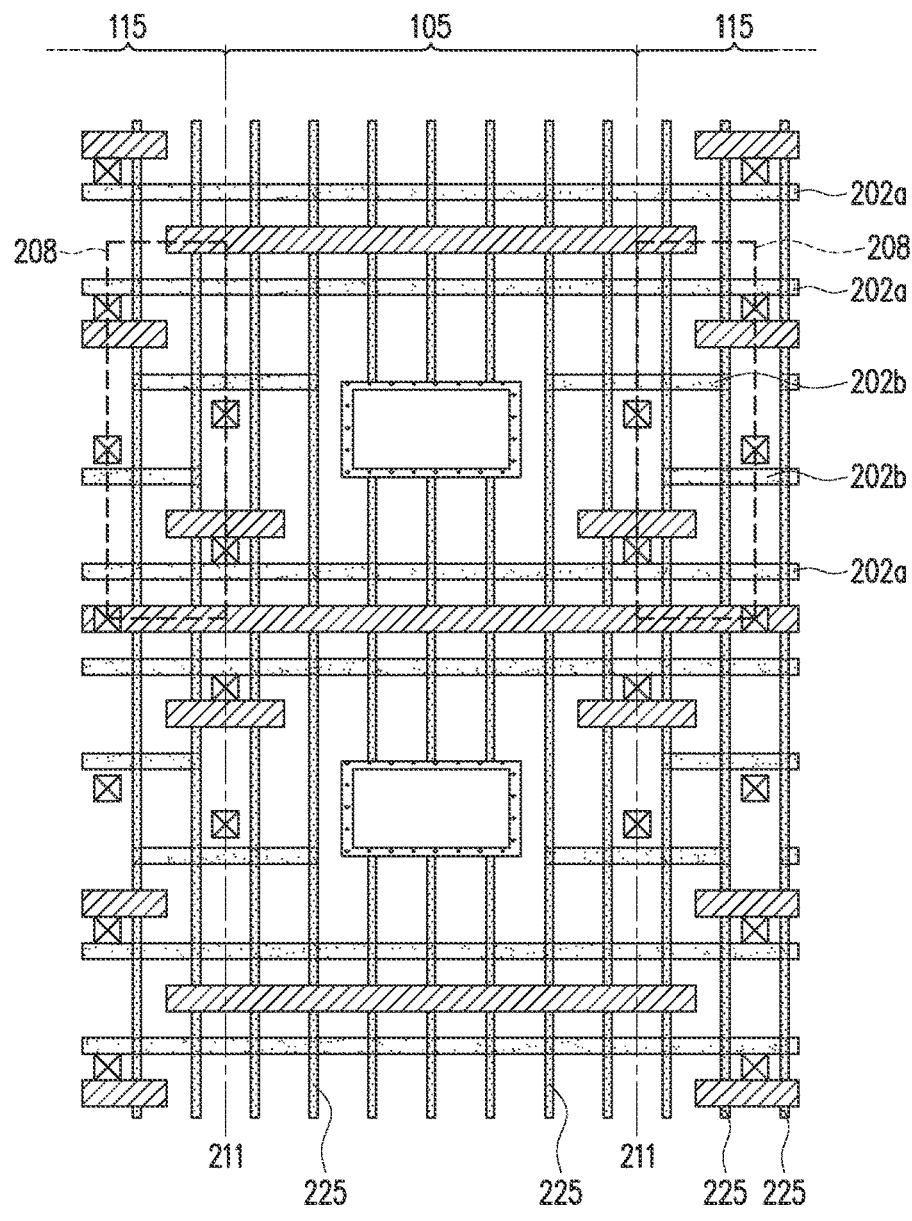

Referring to FIG. 19, shown therein is a top view (or a layout) of the area 200 of FIG. 1 according to another alternative aspect of the present disclosure. For example, in FIG. 19, in contrast to the area 200 in FIG. 17, the dielectric gates 230 are all replaced with two gate structures 225. In such embodiments, as no CPODE features exist in the middle strap area 105, similar advantages or benefits may present.

Although not intended to be limiting, embodiments of the present disclosure provide one or more of the following advantages. For example, the semiconductor device disclosed herein has a middle strap area having a reduced width and a reduced area by implementing the various layouts disclosed herein. The width of the middle strap area is equal to or less than about 9 times of gate pitch (GP), the area of the middle strap area is reduced by about 30% to about 46%, and the area of the memory macro is reduced by about 3% to about 4%, compared to conventional middle strap areas and conventional memory macros. In addition, in some embodiments, mushroom defect is avoided by implementing CPODE features on ends of active regions. The middle strap area disclosed herein also includes pick-up structures such as a feedthrough via to achieve uniform performance among the memory cells of the memory macro.

In one example aspect, the present disclosure is directed to an integrated circuit (IC) that includes a first SRAM cell and a second SRAM cell. The first SRAM cell includes a field-effect transistor (FET). The IC further includes a front interconnect structure over the FET and a back interconnect structure below the FET, and a middle strap area disposed between the first SRAM cell and the second SRAM cell. The middle strap area adjoins the first SRAM cell on a first boundary and adjoins the second SRAM cell on a second boundary opposing the first boundary. The first SRAM cell includes a first contact on the first boundary and the second SRAM cell includes a second contact on the second boundary. The middle strap area includes a plurality of gate stacks and a plurality of dielectric gates extending lengthwise along a first direction and evenly distributed with a gate pitch (GP), a gate isolation structure extending along a second direction perpendicular to the first direction, a third contact surrounded by the gate isolation structure, and a feedthrough via (FTV) in contact with and enclosed by the gate isolation structure from a top view. The FTV is landing on a bottom surface of the third contact and electrically couples the front interconnect structure and the back interconnect structure through the third contact. A distance between the first boundary and the second boundary is equal to or less than about 9 GP.

In an embodiment, the plurality of dielectric gates includes a first dielectric gate and a second dielectric gate disposed on two sides of the gate isolation structure, such that the first dielectric gate and the second dielectric gate sandwich the gate isolation structure along the second direction. In an embodiment, the IC further includes a first active region and a second active region extending from the first SRAM cell to the middle strap area along the second direction. The first active region and the second active region have different widths along the first direction. In an embodiment, the IC further includes a first active region extending from the first SRAM cell to the second SRAM cell along the second direction and adjacent to the gate isolation structure. In an embodiment, the IC further includes a second active region extending from the first SRAM cell to the middle strap area and extending lengthwise along the second direction. In an embodiment, the plurality of dielectric gates includes a dielectric gate disposed on an edge of the second active region. In an embodiment, the dielectric gate further extends through the first active region. In an embodiment, the FTV extends through a dielectric gate of the plurality of dielectric gates.

In another example aspect, the present disclosure is directed an integrated circuit (IC) that includes a first SRAM cell and a second SRAM cell, each including a plurality of field-effect transistors (FETs), a front metal line over the FETs and a back metal line below the FETs, and a middle strap area disposed between the first SRAM cell and the second SRAM cell. The middle strap area includes a plurality of gate stacks extending lengthwise along a direction, a gate isolation structure extending through a gate stack of the plurality of gate stacks, a feedthrough via (FTV) embedded in the gate isolation structure, a first dielectric gate disposed between the FTV and the first SRAM cell, and a second dielectric gate disposed between the FTV and the second SRAM cell. The FTV electrically couples the front metal line and the back metal line.

In an embodiment, the middle strap area further includes a first contact disposed over a top surface of the FTV and embedded in the gate isolation structure, and a second contact disposed over a top surface of the first contact, such that the FTV electrically couples the front metal line and the back metal line through the first contact and the second contact. In an embodiment, the direction is a first direction, and the integrated circuit further includes a continuous active region extending through the first SRAM cell, the middle strap area, and the second SRAM cell along a second direction perpendicular to the first direction. In an embodiment, the first dielectric gate and the second dielectric gate are disposed directly on the continuous active region. In an embodiment, the continuous active region is a first continuous active region and the integrated circuit further includes a second continuous active region extending through the first SRAM cell, the middle strap area, and the second SRAM cell along the second direction. In an embodiment, the first dielectric gate and the second dielectric gate are disposed directly on the first continuous active region and the second continuous active region. In an embodiment, the direction is a first direction, and the integrated circuit further includes a continuous active region extending from the first SRAM cell to the middle strap area along a second direction perpendicular to the first direction. The first dielectric gate is disposed directly on an edge of the continuous active region.

In yet another example aspect, the present disclosure is directed to an integrated circuit (IC) that includes a first SRAM cell and a second SRAM cell, and a middle strap area disposed between the first SRAM cell and the second SRAM cell. The first SRAM cell includes a device. The middle strap area includes a plurality of gate stacks extending lengthwise along a first direction, a gate isolation structure extending through a gate stack of the plurality of gate stacks, a feedthrough via (FTV) enclosed by the gate isolation structure from a top view, and a first active region and a second active region disposed on two sides of the FTV and extending lengthwise along a second direction perpendicular to the first direction. The first active region and the second active region span from the first SRAM cell to the second SRAM cell. The FTV connects a front interconnect structure over the device and a back interconnect structure below the device.

In an embodiment, the IC further includes a third active region extending from the first SRAM cell to the middle strap area, and a fourth active region extending from the middle strap area to the second SRAM cell. The third active region and the fourth active region align and are separated from each other by the gate isolation structure. In an embodiment, the IC further includes a third active region and a fourth active region disposed on two sides of the FTV and extending lengthwise along the second direction. The FTV is disposed between the third active region and the fourth active region along the first direction. In an embodiment, the middle strap area further includes a first dielectric gate extending along the first direction and disposed directly over the first active region and the second active region. In an embodiment, the middle strap area further includes a first dielectric gate extending along the first direction and sandwiched between the first active region and the second active region along the first direction.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An integrated circuit, comprising:
    a first SRAM cell and a second SRAM cell, wherein the first SRAM cell includes a field-effect transistor (FET);
    a front interconnect structure over the FET and a back interconnect structure below the FET; and
    a middle strap area disposed between the first SRAM cell and the second SRAM cell,
    wherein the middle strap area adjoins the first SRAM cell on a first boundary and adjoins the second SRAM cell on a second boundary opposing the first boundary,
    wherein the first SRAM cell includes a first contact on the first boundary and the second SRAM cell includes a second contact on the second boundary, and wherein the middle strap area includes:

a plurality of gate stacks and a plurality of dielectric gates extending lengthwise along a first direction and evenly distributed with a gate pitch (GP), a gate isolation structure extending along a second direction perpendicular to the first direction, a third contact surrounded by the gate isolation structure, and a feedthrough via (FTV) in contact with and enclosed by the gate isolation structure from a top view, wherein the FTV is landing on a bottom surface of the third contact and electrically couples the front interconnect structure and the back interconnect structure through the third contact, wherein a distance between the first boundary and the second boundary is equal to or less than about 9 GP.

2. The integrated circuit of claim 1, wherein the plurality of dielectric gates includes:

a first dielectric gate and a second dielectric gate disposed on two sides of the gate isolation structure, such that the first dielectric gate and the second dielectric gate sandwich the gate isolation structure along the second direction.

3. The integrated circuit of claim 1, further comprising a first active region and a second active region extending from the first SRAM cell to the middle strap area along the second direction, wherein the first active region and the second active region have different widths along the first direction.

4. The integrated circuit of claim 1, further comprising:

a first active region extending from the first SRAM cell to the second SRAM cell along the second direction and adjacent to the gate isolation structure.

5. The integrated circuit of claim 4, further comprising:

a second active region extending from the first SRAM cell to the middle strap area and extending lengthwise along the second direction.

6. The integrated circuit of claim 5, wherein the plurality of dielectric gates includes a dielectric gate disposed on an edge of the second active region.

7. The integrated circuit of claim 6, wherein the dielectric gate further extends through the first active region.

8. The integrated circuit of claim 1, wherein the FTV extends through a dielectric gate of the plurality of dielectric gates.

9. An integrated circuit, comprising:

a first SRAM cell and a second SRAM cell, each including a plurality of field-effect transistors (FETs);

a front metal line over the FETs and a back metal line below the FETs; and a middle strap area disposed between the first SRAM cell and the second SRAM cell, wherein the middle strap area includes:

a plurality of gate stacks extending lengthwise along a direction, a gate isolation structure extending through a gate stack of the plurality of gate stacks, a feedthrough via (FTV) embedded in the gate isolation structure, wherein the FTV electrically couples the front metal line and the back metal line, a first dielectric gate disposed between the FTV and the first SRAM cell, and a second dielectric gate disposed between the FTV and the second SRAM cell.

10. The integrated circuit of claim 9, wherein the middle strap area further includes:

a first contact disposed over a top surface of the FTV and embedded in the gate isolation structure, and a second contact disposed over a top surface of the first contact, such that the FTV electrically couples the front metal line and the back metal line through the first contact and the second contact.

11. The integrated circuit of claim 9, wherein the direction is a first direction, the integrated circuit further comprising a continuous active region extending through the first SRAM cell, the middle strap area, and the second SRAM cell along a second direction perpendicular to the first direction.

12. The integrated circuit of claim 11, wherein the first dielectric gate and the second dielectric gate are disposed directly on the continuous active region.

13. The integrated circuit of claim 11, wherein the continuous active region is a first continuous active region, the integrated circuit further comprising a second continuous active region extending through the first SRAM cell, the middle strap area, and the second SRAM cell along the second direction.

14. The integrated circuit of claim 13, wherein the first dielectric gate and the second dielectric gate are disposed directly on the first continuous active region and the second continuous active region.

15. The integrated circuit of claim 9, wherein the direction is a first direction, the integrated circuit further comprising a continuous active region extending from the first SRAM cell to the middle strap area along a second direction perpendicular to the first direction, wherein the first dielectric gate is disposed directly on an edge of the continuous active region.

16. An integrated circuit, comprising:

a first SRAM cell and a second SRAM cell, wherein the first SRAM cell includes a device; and a middle strap area disposed between the first SRAM cell and the second SRAM cell, wherein the middle strap area includes:

a plurality of gate stacks extending lengthwise along a first direction, a gate isolation structure extending through a gate stack of the plurality of gate stacks, a feedthrough via (FTV) enclosed by the gate isolation structure from a top view, and a first active region and a second active region disposed on two sides of the FTV and extending lengthwise along a second direction perpendicular to the first direction, wherein the first active region and the second active region span from the first SRAM cell to the second SRAM cell, and wherein the FTV connects a front interconnect structure over the device and a back interconnect structure below the device.

17. The integrated circuit of claim 16, further comprising:

a third active region extending from the first SRAM cell to the middle strap area; and a fourth active region extending from the middle strap area to the second SRAM cell, wherein the third active region and the fourth active region align and are separated from each other by the gate isolation structure.

18. The integrated circuit of claim 16, further comprising:

a third active region and a fourth active region disposed on two sides of the FTV and extending lengthwise along the second direction, wherein the FTV is disposed between the third active region and the fourth active region along the first direction.

19. The integrated circuit of claim 16, wherein the middle strap area further includes a first dielectric gate extending along the first direction and disposed directly over the first active region and the second active region.

20. The integrated circuit of claim 16, wherein the middle strap area further includes a first dielectric gate extending along the first direction and sandwiched between the first active region and the second active region along the first direction.

\* \* \* \* \*